(12) United States Patent
Goto

(10) Patent No.: US 8,154,057 B2
(45) Date of Patent: Apr. 10, 2012

(54) SOLID-STATE IMAGING DEVICE AND DRIVING METHOD THEREOF

(75) Inventor: Ryoichi Goto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/023,994

(22) Filed: Feb. 9, 2011

(65) Prior Publication Data

US 2011/0193137 A1  Aug. 11, 2011

(30) Foreign Application Priority Data

Feb. 9, 2010  (JP) .................................. 2010-026885
Sep. 6, 2010  (JP) .................................. 2010-198571

(51) Int. Cl.
  *H01L 27/148*  (2006.01)
  *H01L 29/768*  (2006.01)
  *H01L 31/062*  (2006.01)
  *H01L 31/113*  (2006.01)

(52) U.S. Cl. ....................................... 257/222; 257/291

(58) Field of Classification Search .................. 257/222, 257/291, E27.15
See application file for complete search history.

(56) References Cited

FOREIGN PATENT DOCUMENTS

JP         3366656      11/2002
JP       2008-258571    10/2008

*Primary Examiner* — William M. Brewster
(74) *Attorney, Agent, or Firm* — Young & Thompson

(57) ABSTRACT

A solid-state imaging device includes: a photoelectric converting section comprising a photo-diode; a charge storage section; a charge transfer section; a first control gate section provided between the photoelectric converting section and the charge storage section to control transfer of a signal charge from the photoelectric converting section to the charge storage section; and a second control gate section provided between the charge storage section and the charge transfer section to control transfer of the signal charge from the charge storage section to the charge transfer section. The charge storage section includes: a first region formed on a side near to the first control gate section; and a second region formed on a side near to the second control gate section and configured to have a channel potential increased more than that of the first region. The second region is configured to hold the signal charge in a pinning condition.

16 Claims, 29 Drawing Sheets

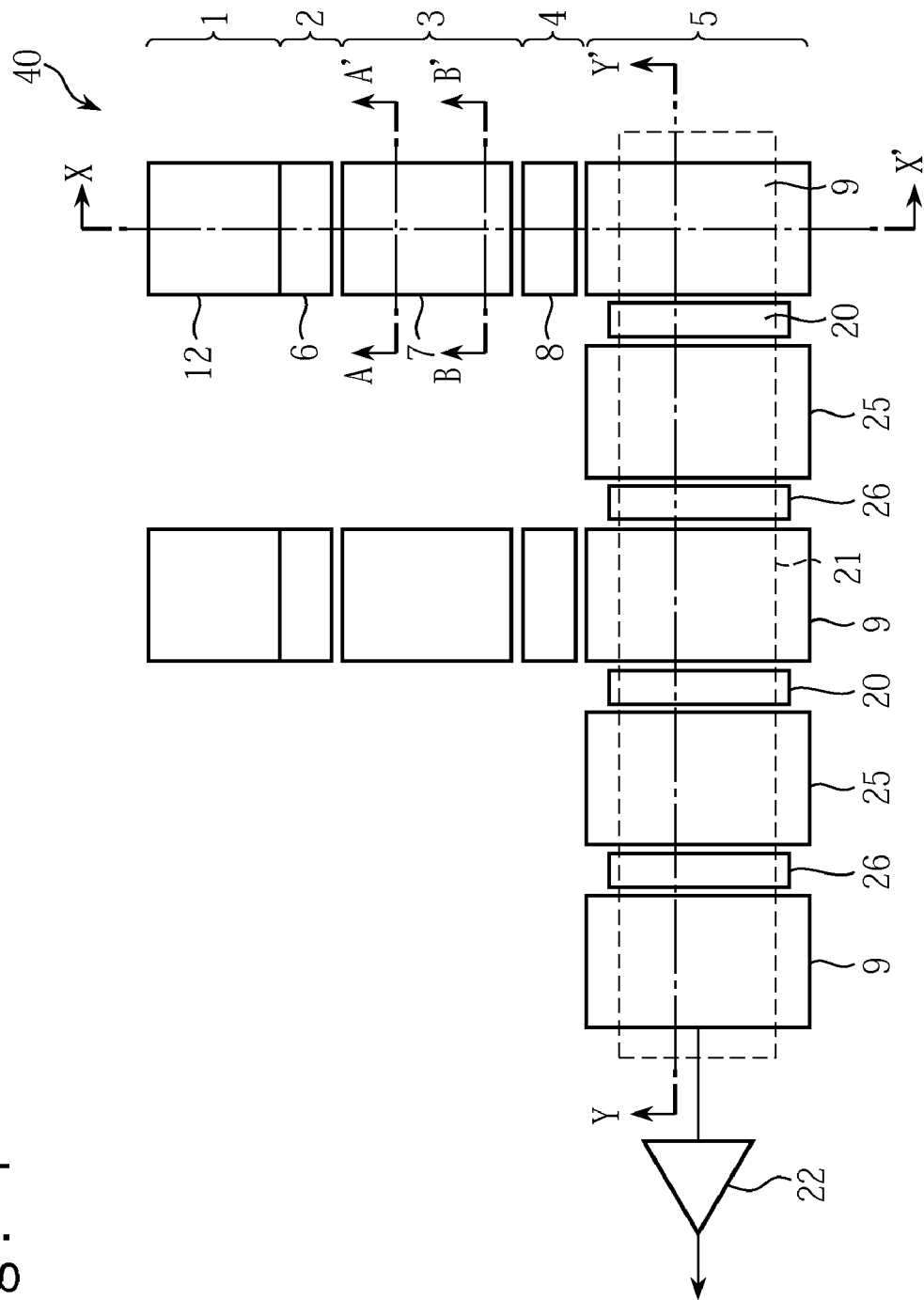

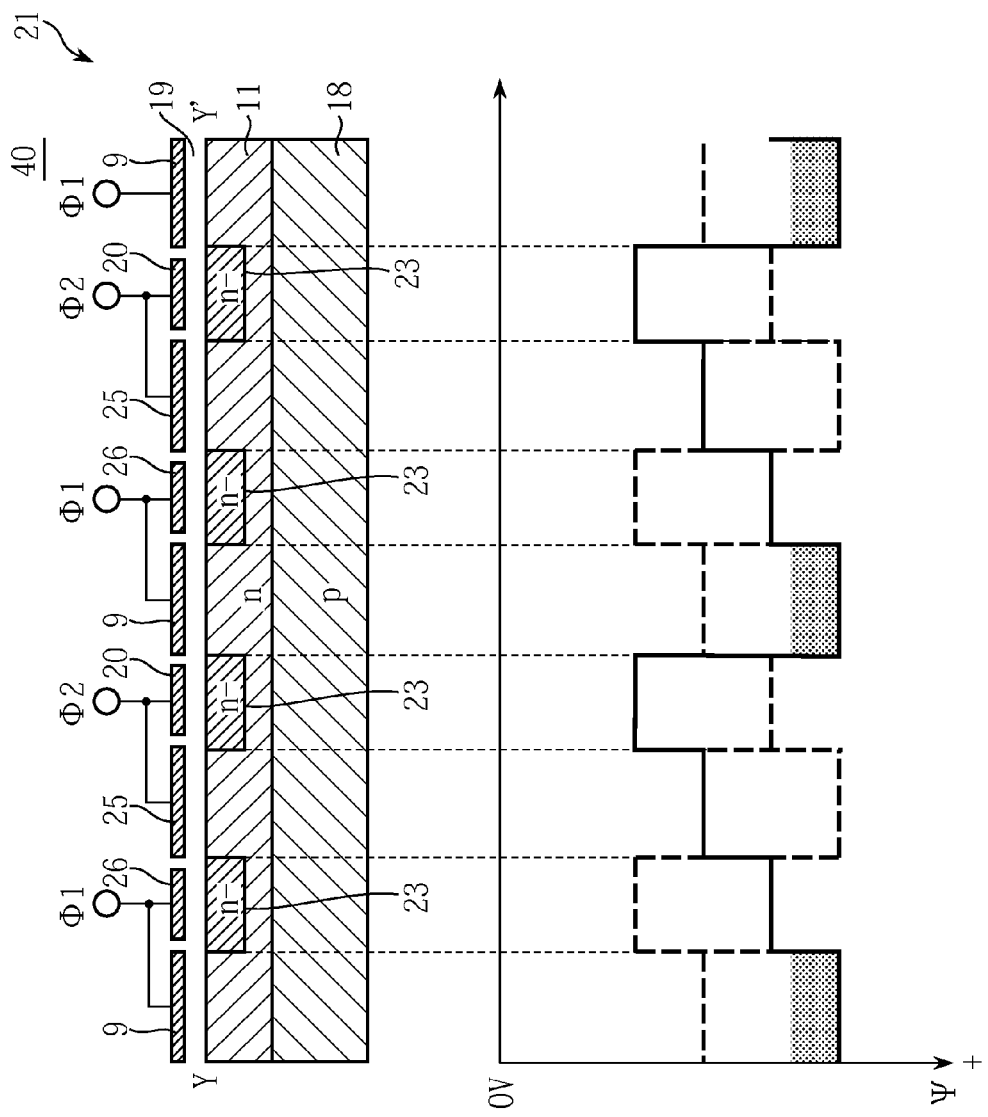

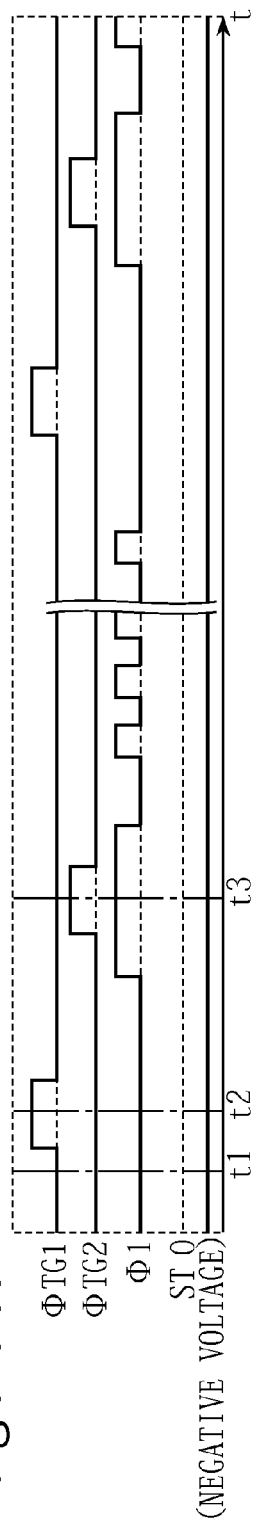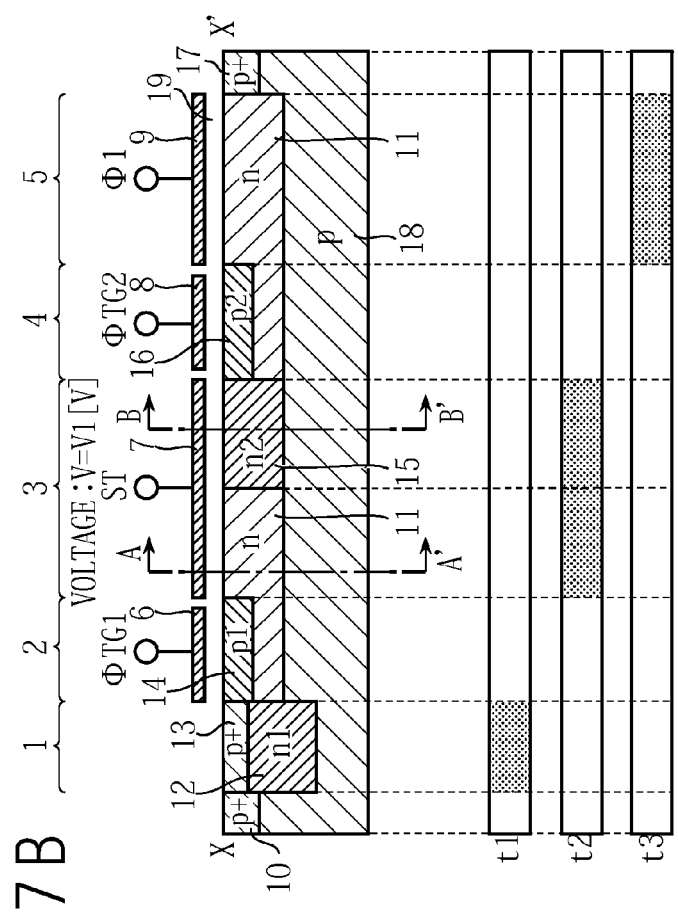

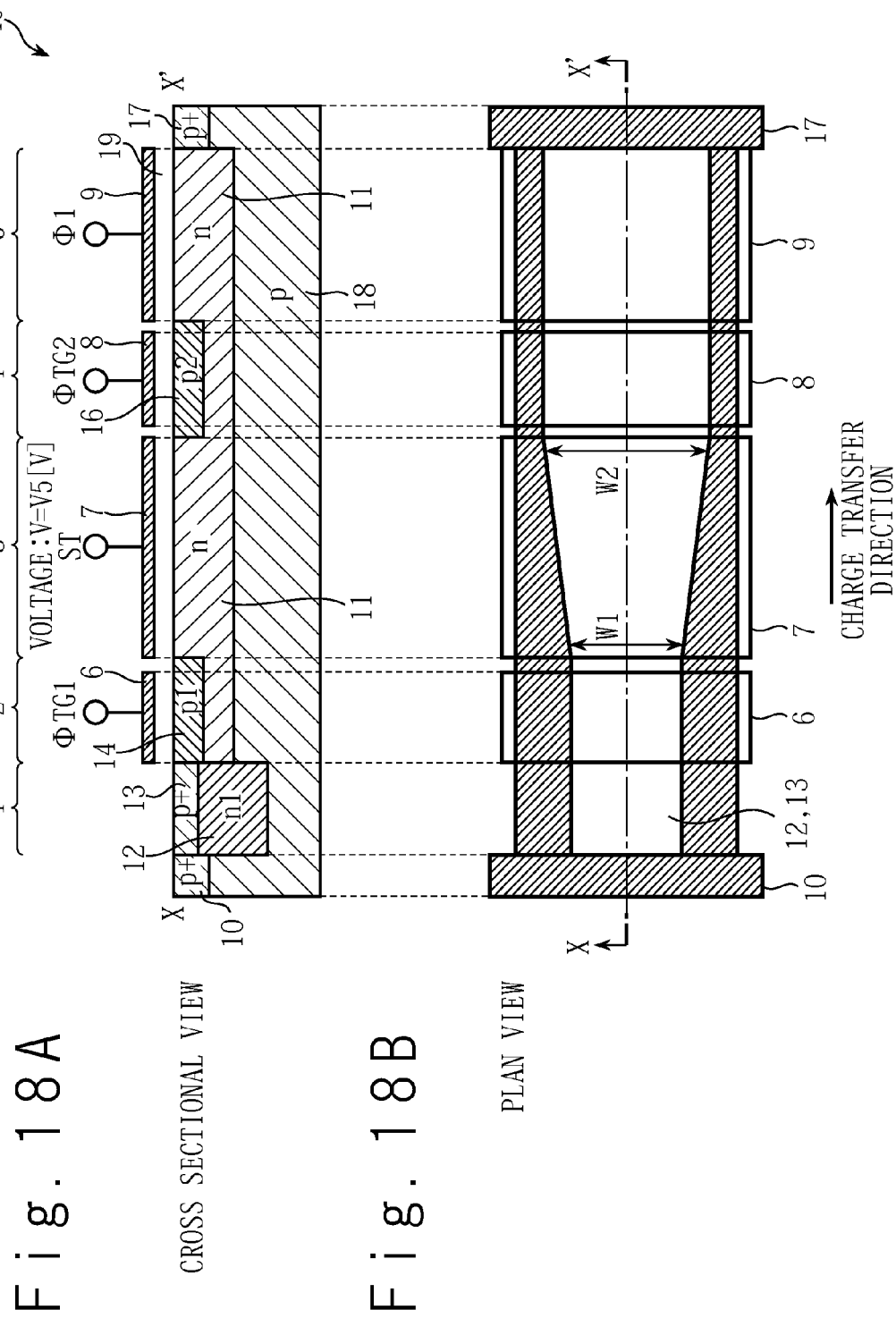

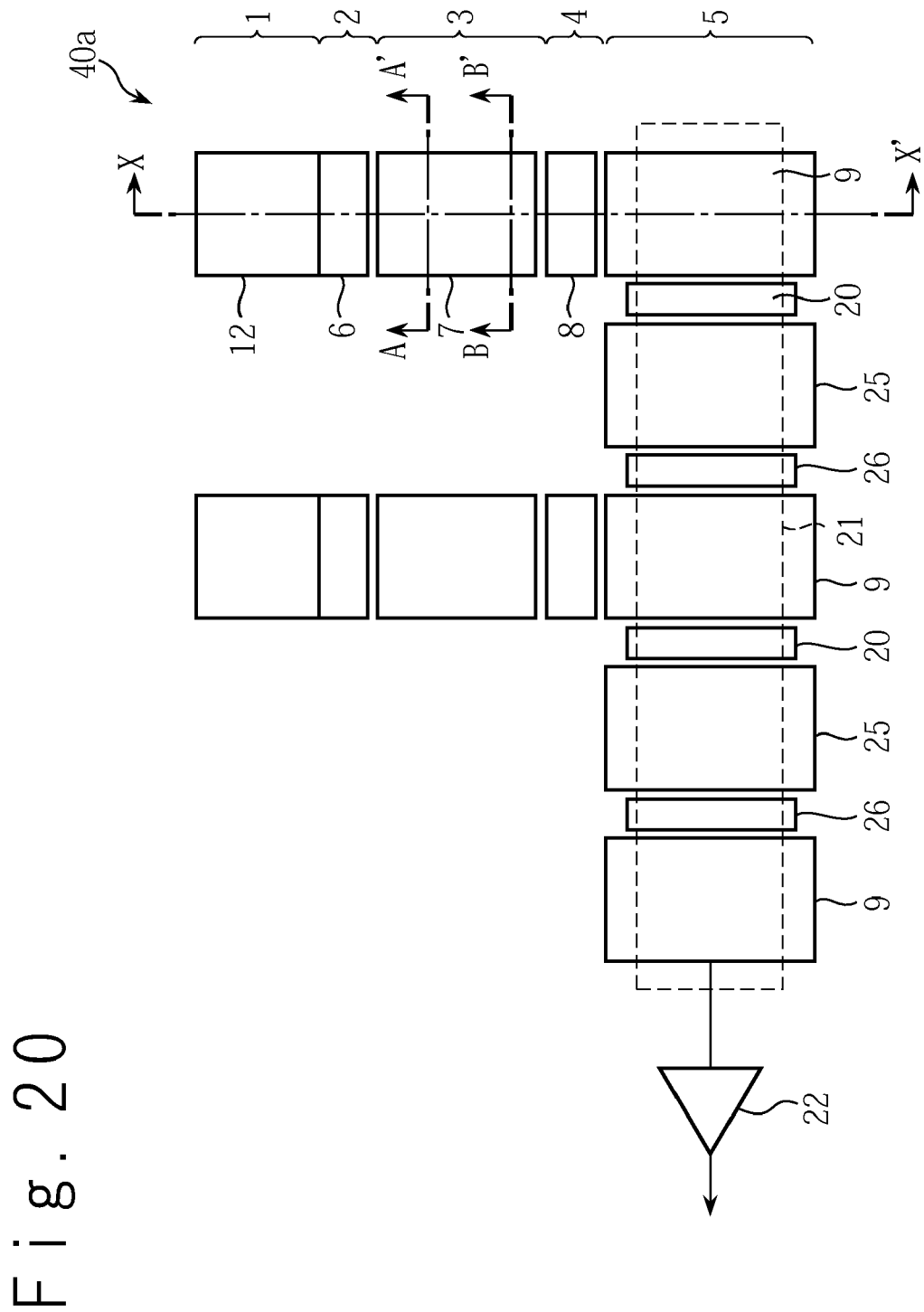

SOLID-STATE IMAGING DEVICE AND DRIVING METHOD THEREOF

INCORPORATION BY REFERENCE

This patent application claims priorities on convention based on Japanese Patent Application No. 2010-26885 filed on Feb. 9, 2010 and Japanese Patent Application No. 2010-198571 filed on Sep. 6, 2010. The disclosures thereof are incorporated herein by reference.

TECHNICAL FIELD

The present invention relates to a solid-state imaging device and a driving method thereof.

BACKGROUND ART

In one of structures of solid-state imaging devices, a charge storage section (or memory) is interposed between a photodiode and a CCD section to temporarily store charges. In an image sensor provided with the charge storage section, since a dark current increases in proportion to a time period for which the charges are held in the charge storage section, image degradation becomes more remarkable in a case of storing the charges for a longer time period. Also, the dark current is almost doubled in the temperature rise by 8 to 10° C. Because of the above reasons, in the solid-state imaging device having the charge storage section, a method is adopted of applying a negative voltage to a gate electrode arranged above the charge storage section so that the interface between a gate oxide film and a silicon substrate is pinned to a ground potential, to suppress the dark current due to interface levels (e.g. Patent Literature 1).

Patent literature 1 discloses a technique relating to a solid-state imaging device in which signal charges can be held for an optionally controlled light reception time and the signal charges can be transferred without generation of afterimages while suppressing generation of a dark current.

FIG. 1A is a cross sectional view of a solid-state imaging device 100 disclosed in Patent Literature 1. FIG. 1B is a diagram showing a transition state of potential wells in a depth direction. A solid line and a broken line in FIG. 1B indicate a transition of a potential level depending on a voltage applied to each electrode. The solid-state imaging device 100 has a charge transfer gate section 102 interposed between a photoelectric conversion section (i.e. photodiode) 101 and a charge storage section 103. Also, a charge transfer gate section 104 is interposed between the charge storage section 103 and a CCD section 105. An n-type diffusion layer 112 with the impurity concentration of n1 is arranged in a p-type semiconductor substrate 118 and a p$^+$-type diffusion layer 113 is arranged on the n-type diffusion layer 112. These diffusion layers constitute the photoelectric conversion section (or photodiode) 101 in the solid-state imaging device 100.

An n-type diffusion layer 111 (with the impurity concentration of n) is arranged in a range from the charge transfer gate section 102 to the CCD section 105. A p-type diffusion layer 114 with the impurity concentration of p1 is arranged under a charge transfer gate electrode 106. A p-type diffusion layer 116 with the impurity concentration of p2 is arranged under a charge transfer gate electrode 108. On outer sides of the photoelectric conversion section (or photodiode) 101 and the CCD section 105, a p$^+$-type diffusion layer 110 and a p$^+$-type diffusion layer 117 are respectively arranged for element isolation. A drive pulse •TG1 is applied to the charge transfer gate electrode 106, a drive pulse •TG2 is applied to the charge transfer gate electrode 108, a drive pulse •1 is applied to a CCD section gate electrode 109, and a DC voltage V2 is applied to a charge storage gate electrode 107. Also, in general, the p-type semiconductor substrate 118 is connected to the ground potential (not shown).

Charges stored in the photoelectric conversion section (or photodiode) 101 are transferred to a region under the charge storage gate electrode 107 when the drive pulse •TG1 is turned on and the drive pulse •TG2 is turned off. After the transfer is completed, the drive pulse •TG1 is turned off. Next, after temporarily storing the charges in the charge storage section 103, the drive pulse •TG2 is turned on and the drive pulse •1 is further turned on, so as to transfer the stored charges to the CCD section 105. After completion of the transfer, the drive pulse •TG2 is turned off. Thereafter, the charges stored in the CCD section 105 are transferred to an output amplifier (not shown) by a pulse-driving technique.

Because the n-type diffusion layer 111 with the impurity concentration of n is formed in a range from the photoelectric conversion section (or photodiode) 101 to the CCD section 105, a so-called embedded channel is produced in which a charge transfer path is not provided on a Si surface. An upper portion of FIG. 2 shows a cross section of the charge storage section 103 along the line C-C' in FIG. 1A. A lower portion of FIG. 2 is a diagram showing a potential distribution in a depth direction of the cross section. A negative voltage equal to or less than a pinning start voltage is applied to the charge storage gate electrode 107. An interface between the n-type diffusion layer 111 with the impurity concentration of n and a gate oxide film 119 is set to the ground (GND) potential, like of the p-type semiconductor substrate 118. Therefore, generation of a dark current due to interface levels is suppressed.

According to the trend of resolution improvement in an image sensor in recent years, a pixel pitch is shortened greatly and a channel width in a charge storage section is also narrowed. Because characteristics such as sensitivity and a saturation charge amount are maintained to a certain degree through structural improvement of photodiode and area extension even if the pixel pitch is shortened, the charge storage section needs to have an adequate charge storage capacity. Accordingly, it is necessary to extend the charge storage section into a transfer direction, and it sometimes causes a problem of degradation of charge transfer efficiency. A technique to improve charge transfer efficiency is known by Patent Literature 2, for example.

Patent Literature 2 discloses a technique for improving signal charge transfer speed by changing a length of a transfer electrode and dividing a channel section disposed under a longer transfer electrode, into regions having different impurity concentrations. The technique according to Patent Literature 2 realizes under a constant transfer frequency, reduction of transfer remainder of the signal charges and improvement of transfer quality. The technique according to Patent Literature 2 also makes it possible to increase the transfer frequency if the transfer is carried out with the same quality.

FIGS. 3A and 3B are diagrams showing a schematic structure of a solid-state imaging device according to Patent Literature 2. FIG. 3A is a cross sectional view showing a solid-state imaging device 200. FIG. 3B shows a potential diagram under each gate electrode in the cross section. A solid line and a broken line in FIG. 3B show a transition state of a potential distribution according to a voltage applied to each electrode. Referring to FIG. 3A, in a p-type semiconductor substrate 133 of the solid-state imaging device 200, an n-type diffusion layer 132 with the impurity concentration of n⁻ is arranged. Under each of a second-layer gate electrode 128 and a second-layer gate electrode 130, an n-type diffusion layer 131 with the impurity concentration of n is arranged. Therefore, a so-called embedded channel is generated in which a charge transfer path does not pass through a Si surface. A first-layer gate electrode 127, a first-layer gate electrode 129, the second-layer gate electrode 128 and the second-layer gate electrode 130 are arranged on a main surface of the silicon substrate through a gate oxide film. A drive pulse •4, a drive pulse •2, a drive pulse •1 and a drive pulse •3 are applied to the gate electrodes, respectively, for the purpose of charge transfer.

The n-type diffusion layer 131 is arranged partially under the second-layer gate electrode 128 and the second-layer gate electrode 130. Thus, as shown in FIG. 3B, a channel potential difference is generated under the same gate electrode, to strengthen a transfer electric field, resulting in improvement of charge transfer efficiency.

Citation List:
[Patent Literature 1]: JP 2008-258571A
[Patent Literature 2]: Japanese Patent No. 3366656

SUMMARY OF THE INVENTION

According to the trend of resolution improvement in an image sensor in recent years, a pixel pitch is shortened substantially and a channel width in a charge storage section is also narrowed. In order to ensure a charge storage capacity of a charge storage section to cope with a narrow array pitch, it is necessary to extend the charge storage section into a transfer direction. The extension of the charge storage section causes degradation of charge transfer efficiency. If the technique according to Patent Literature 2 is simply adapted to the technique according to Patent Literature 1 in order to improve transfer efficiency, a dark current is generated to degrade image quality.

The subject matter of the present invention is to provide a technique for improving charge transfer efficiency while suppressing generation of a dark current in a solid-state imaging device.

An aspect of the present invention, a solid-state imaging device includes: a photoelectric converting section comprising a photo-diode; a charge storage section; a charge transfer section; a first control gate section provided between the photoelectric converting section and the charge storage section to control transfer of a signal charge from the photoelectric converting section to the charge storage section; and a second control gate section provided between the charge storage section and the charge transfer section to control transfer of the signal charge from the charge storage section to the charge transfer section. The charge storage section includes: a first region formed on a side near to the first control gate section; and a second region formed on a side near to the second control gate section and configured to have a channel potential increased more than that of the first region. The second region is configured to hold the signal charge in a pinning condition.

According to the present invention, in the solid-state imaging device, it is possible to provide a technique for improving charge transfer efficiency while suppressing generation of the dark current.

Each of regions under charge storage gate electrodes has a different impurity concentration, and a voltage setting range is defined to allow pinning in the entire region, whereby the charge transfer efficiency can be improved to correspond to the resolution enhancement while suppressing generation of the dark current.

Also, a channel under a charge storage gate electrode is varied in width and a voltage setting range is defined to allow pinning in the entire region, whereby the charge transfer efficiency can be improved to correspond to the resolution enhancement while suppressing generation of the dark current.

BRIEF DESCRIPTION OF THE DRAWINGS

The above and other objects, advantages and features of the present invention will be more apparent from the following description of certain embodiments taken in conjunction with the accompanying drawings, in which:

FIG. 4 is a plan view showing a configuration of a solid-state imaging device according to a first embodiment of the present invention;

FIG. 6A shows a cross section of the solid-state imaging device along the line Y-Y' in the plan view of FIG. 4;

FIG. 6B shows a transition state of potential wells in the cross section of FIG. 6A;

FIG. 7A shows timing charts in an operation of the solid-state imaging device in the first embodiment;

FIG. 7B is a potential diagram showing a charge transition state in the operation of the solid-state imaging device in the first embodiment;

FIG. 18A is a cross sectional view showing the configuration of the solid-state imaging device according to a fourth embodiment of the present invention;

FIG. 18B shows a plan view of a portion corresponding to the cross section of FIG. 18A;

FIG. 20 is a plan view showing a configuration of a solid-state imaging device according to a fifth embodiment of the present invention;

DESCRIPTION OF EMBODIMENTS

Figure 1A:
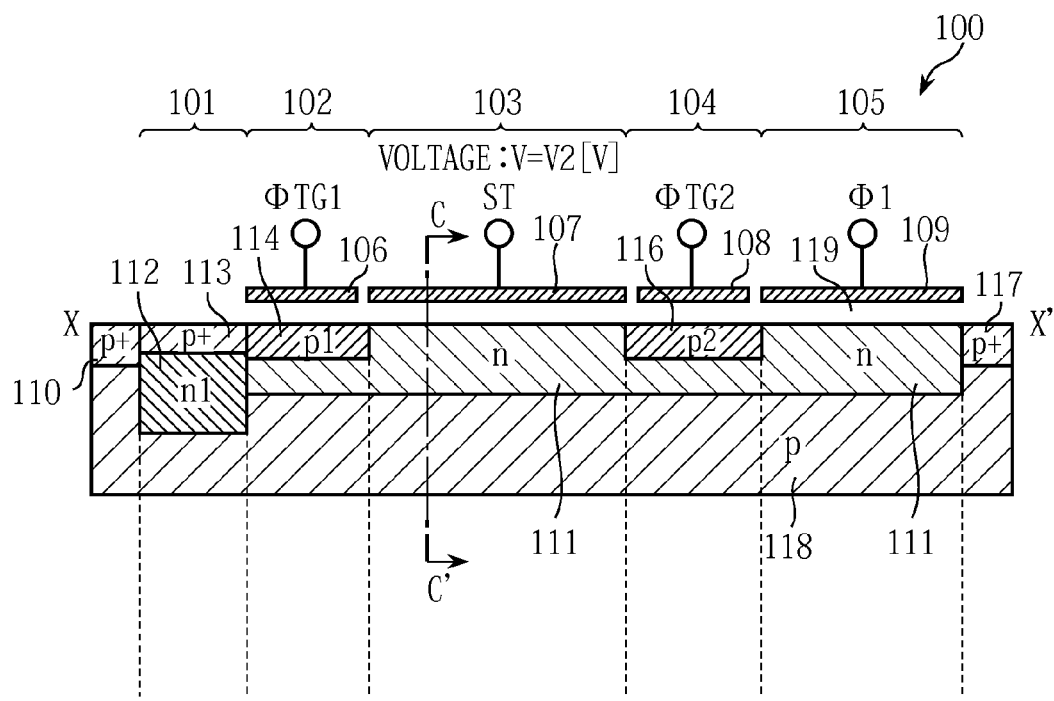
FIG. 1A is a cross sectional view showing a conventional solid-state imaging device.

The present invention will be described below with reference to the attached drawings. Here, it should be noted that same reference numerals are assigned to same components, and repetitive description thereof will be omitted.

[First Embodiment]

The solid-state imaging device 40 has a photoelectric conversion section (or photodiode) 1 including an n-type diffusion layer 12 with the impurity concentration of n1, a charge transfer gate section 2 including a charge transfer gate electrode 6, a charge storage section 3 including a charge storage gate electrode 7, a charge transfer gate section 4 including a charge transfer gate electrode 8, and a CCD section 5 including a CCD region 21. In the solid-state imaging device 40, the charge transfer gate section 2 is interposed between the photoelectric conversion section (e.g. photodiode) 1 and the charge storage section 3. The charge transfer gate section 4 is interposed between the charge storage section 3 and the CCD section 5. The CCD section 5 is provided with a set of a CCD section gate electrode 9, a CCD section gate electrode 20, a CCD section gate electrode 25, and a CCD section gate electrode 26 for a change transfer row, and an output amplifier 22 is arranged in one end of the sets.

Figure 5A:
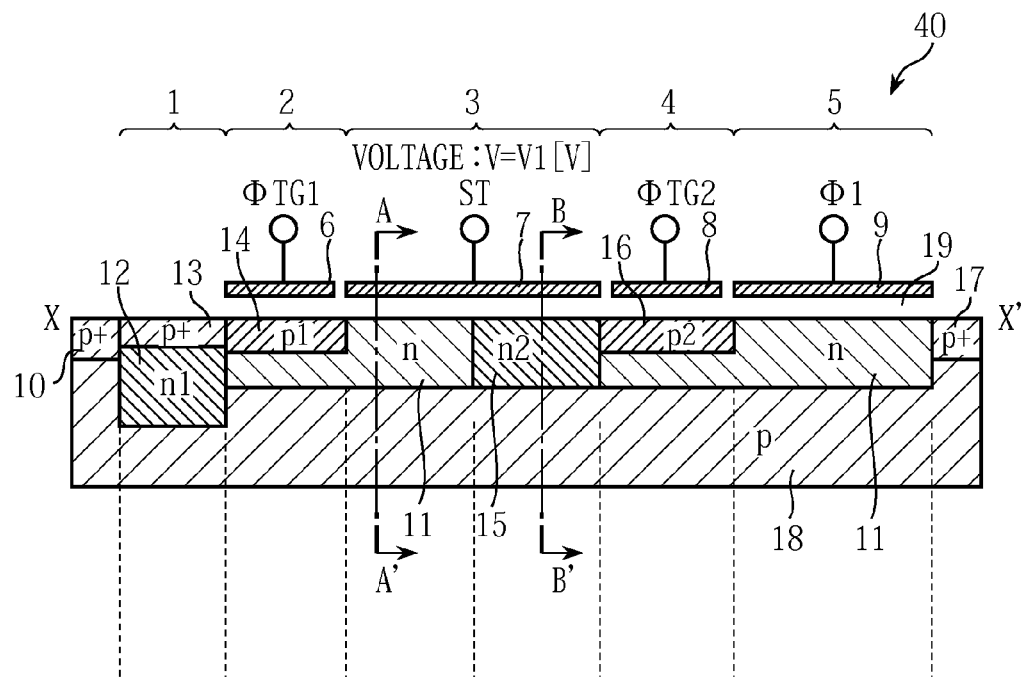
FIG. 5A shows a cross section of the solid-state imaging device along the line X-X' in the plan view of FIG. 4.
Figure 5B:
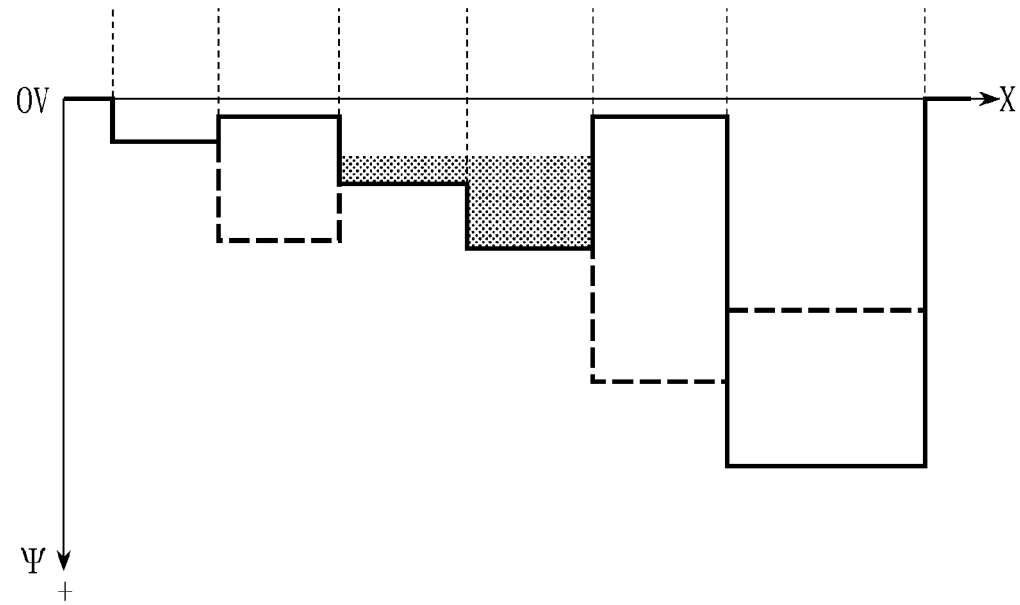
FIG. 5B is a potential diagram in the cross section of FIG. 5A.

FIGS. 5A and 5B show a cross section of the solid-state imaging device 40 along the line X-X' in the plan view and a potential diagram in the cross section, respectively. A solid line and a broken line in FIG. 5B show a transition state of a potential distribution according to a voltage applied to each of the electrodes (i.e. the charge transfer gate section 2, the charge transfer gate section 4 and the CCD section 5).

As shown in FIG. 5A, the solid-state imaging device 40 has the n-type diffusion layer 12 with the impurity concentration of n1 in a p-type semiconductor substrate 18. A $p^+$-type diffusion layer 13 is arranged on the surface of the n-type diffusion layer 12 with the impurity concentration of n1. The photoelectric conversion section (or photodiode) 1 is formed by including the n-type diffusion layer 12 and the $p^+$-type diffusion layer 13.

The solid-state imaging device 40 also has an n-type diffusion layer with the impurity concentration of n in a range from the charge transfer gate section 2 to the CCD section 5. A p-type diffusion layer 14 with the impurity concentration of p1 is arranged under the charge transfer gate electrode 6. A p-type diffusion layer 16 with the impurity concentration of p2 is arranged under the charge transfer gate electrode 8. Thus, the solid-state imaging device 40 according to the present embodiment has an n-type diffusion layer 15 with the impurity concentration of n2 in a region under the charge storage gate electrode 7 on the side of the CCD section 5.

Here, as a method of forming the n-type diffusion layer 15 with the impurity concentration of n2, for example, a region with the impurity concentration of n is formed in a first ion implantation by using a mask opened in a range from the charge transfer gate section 2 to the CCD section 5. Then, a second ion implantation of the impurity concentration of na is additionally performed by using a mask opened in only the n-type diffusion layer 15. That is, n2=n+na, and n is smaller than n2. This is one example and an optional manufacturing method can be applied as long as n<n2 is satisfied. A gate oxide film (gate insulating film) 19 is formed between each of the gate electrodes and the silicon substrate. A p+-type diffusion layer 10 and a p+-type diffusion layer 17 are respectively arranged for element isolation on one sides of the photoelectric conversion section (or photodiode) 1 and the CCD section 5.

FIG. 6A shows a cross section of the solid-state imaging device 40 along the line Y-Y' in the plan view of FIG. 4. FIG. 6B shows a transition state of potential wells in the cross section. As shown in FIG. 6A, the solid-state imaging device 40 has the n-type diffusion layer 11 with the impurity concentration of n in the p-type semiconductor substrate 18. The CCD section gate electrode 9, the CCD section gate electrode 20, the CCD section gate electrode 25 and the CCD section gate electrode 26 are arranged on a main surface of the silicon substrate 18 via the gate oxide film 19. An n-type diffusion layer 23 with the impurity concentration of n− is arranged under each of the CCD section gate electrode 20 and the CCD section gate electrode 26. First-layer gate electrodes are connected by a wiring every two electrodes (a combination of the CCD section gate electrode 9 and the CCD section gate electrode 26 and a combination of the CCD section gate electrode 25 and the CCD section gate electrode 20). A drive pulse •1 and a drive pulse •2 are applied to the combination of the CCD section gate electrode 9 and the CCD section gate electrode 26 and the combination of the CCD section gate electrode 25 and the CCD section gate electrode 20, respectively.

Ion implantation energy and an impurity amount in ion implantation in each of the diffusion layers are shown below as an example.

p+-type diffusion layer 10: 30 keV, $5.0 \times 10^{13}/cm^2$
p+-type diffusion layer 17: 30 keV, $5.0 \times 10^{13}/cm^2$
n-type diffusion layer 11: 150 keV, $2.0 \times 10^{12}/cm^2$
n-type diffusion layer 12: 300 keV, $1.5 \times 10^{12}/cm^2$
p+-type diffusion layer 13: 30 keV, $1.0 \times 10^{13}/cm^2$
p-type diffusion layer 14: 50 keV, $4.0 \times 10^{12}/cm^2$
n-type diffusion layer 15: 150 keV, $3.0 \times 10^{12}/cm^2$
p-type diffusion layer 16: 50 keV, $4.0 \times 10^{12}/cm^2$ It should be noted that the p-type semiconductor substrate 18 has the impurity concentration of about $2.0 \times 10^{15}/cm^3$, the thickness of the gate oxide film 19 is about 500 to 1000•. In addition, a drive pulse •TG1 is applied to the charge transfer gate electrode 6. A drive pulse •TG2 is applied to the charge transfer gate electrode 8. The drive pulse •1 is applied to the CCD section gate electrode 9. A DC Voltage V1 is applied to the charge storage gate electrode 7. The p-type semiconductor substrate 18 is also set to a GND potential (not shown).

An operation of the solid-state imaging device 40 according to the first embodiment will be described below. FIG. 7A shows timing charts in an operation of the solid-state imaging device 40 according to the first embodiment. FIG. 7B is a potential diagram showing a charge transition state in the operation. Referring to FIG. 7A, at time t1, charges generated in the photoelectric conversion section (or photodiode) 1 in response to incident light are stored. At time t2, the drive pulse •TG1 is turned on to transfer the charges to the charge storage section 3. At time t3, the drive pulse •TG2 is turned on to transfer the charges to the CCD section 5. The charges transferred to the CCD section 5 are transferred to the CCD region 21 by the two-phase drive pulses •1 and •2 and outputted via the output amplifier 22.

Applied voltages are shown below as an example.
•TG1: voltage pulse of low 0 [V] to high 5[V]
ST: DC voltage of −10V [V]
•TG2: voltage pulse of low 0 [V] to high 10[V]
•1: voltage pulse of low 0 [V] to high 5[V]
•2: voltage pulse with phase opposite to •1

In general, if entire signal charges are transferred only through diffusion, a transfer time is in proportion to a square of a gate length of a transfer electrode. Also, if entire signal charges are transferred only through a fringe electric field, a transfer time is in proportion to a cube of the gate length.

In the solid-state imaging device 40 according to the present embodiment, it is assumed that the gate length of the charge storage gate electrode 7 is L. When the n-type diffusion layer 11 with the impurity concentration of n and the n-type diffusion layer 15 with the impurity concentration of n2 are arranged evenly by the length of L/2, it will be concluded that an effective gate length is equivalent to a serial connection of two electrodes of L/2. When the charge transfer is carried out entirely through diffusion, the charge transfer time is ½ in a case of the existence of the n-type diffusion layer 15 with the impurity concentration of n2, if the charge transfer time is assumed to be 1 in a case of non-existence of the n-type diffusion layer 15 with the impurity concentration of n2.

Because in practice, a fringe electric field is applied to a boundary between the n-type diffusion layer 11 and the n-type diffusion layer 15 and the transfer is carried out by the fringe electric field, it could be easily inferred that the transfer time can be further shortened. A channel potential which generates the fringe electric field will be described.

Figure 8:
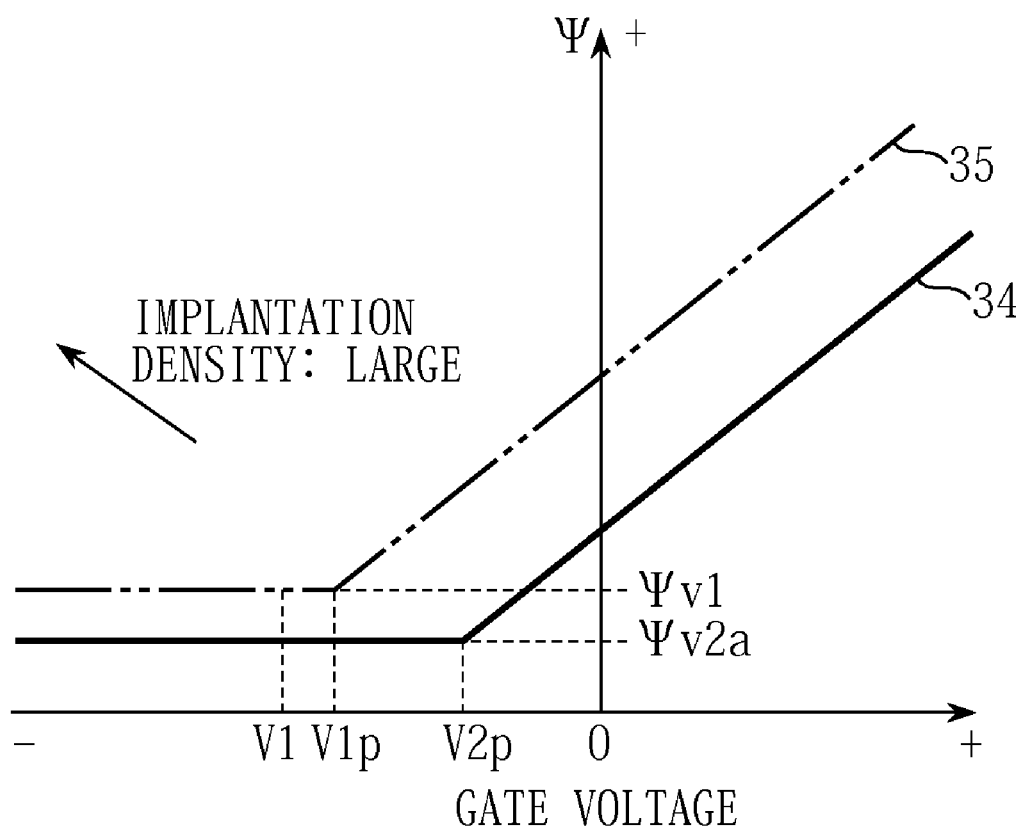
FIG. 8 is a graph showing a channel potential characteristic at two points, where impurity concentrations are different, under the charge storage gate electrode.

FIG. 8 is a graph showing channel potential characteristic at two points, where impurity concentrations are different, under the charge storage gate electrode. A curve 34 shows a channel potential characteristic of a region with the impurity concentration of n under the charge storage gate electrode 7. A curve 35 shows a channel potential characteristic of a region with the impurity concentration of n2. A pinning start voltage in the curve 34 is shown as V2p. A pinning potential in the curve 34 is shown as •v2a. Meanwhile, a pinning start voltage in the curve 35 is shown as V1p. A pinning potential in the curve 35 is shown as •v1.

In the solid-state imaging device 40 according to the present embodiment, the DC voltage V1 applied to the charge storage gate electrode 7 is set to the pinning start voltage V1p or less. By applying the DC voltage V1 to the charge storage gate electrode 7, a channel potential in the n-type diffusion layer 11 with the impurity concentration of n is set to the pinning potential •v2a, and a channel potential in the n-type diffusion layer 15 with the impurity concentration n2 is set to the pinning potential •v1. Therefore, a channel potential difference (i.e. •v1−•v2a) is observed in the vicinity of the boundary between the n-type diffusion layer 11 with the impurity concentration of n and the n-type diffusion layer 15 with the impurity concentration of n2 under the charge storage gate electrode 7. A fringe electric field is therefore generated and transfer efficiency is improved.

Figure 9:
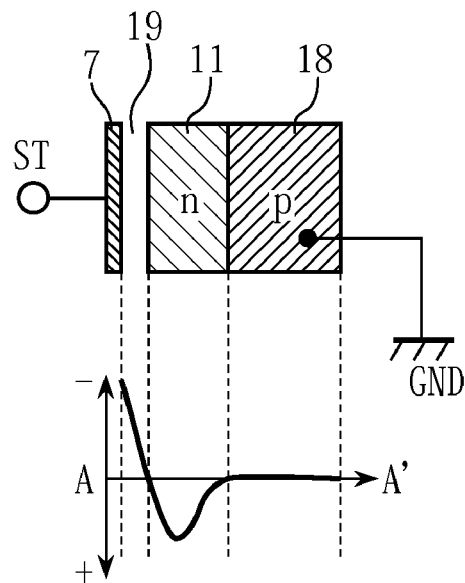
FIG. 9 shows a cross section of the charge storage section along the line A-A' in the sectional view of FIG. 5 and a potential diagram in a depth direction of the cross section.
Figure 10:
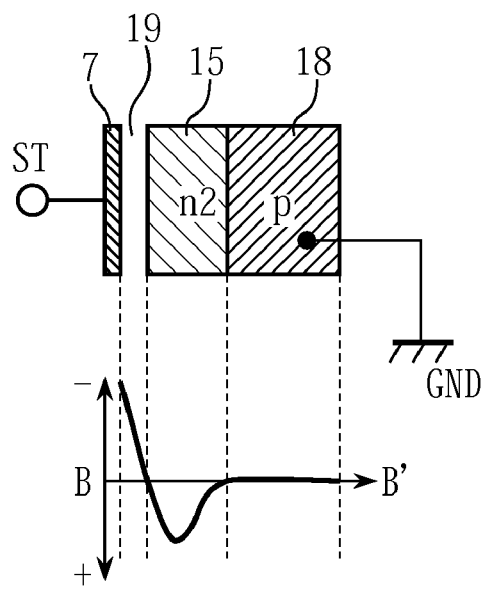
FIG. 10 shows a cross section of the charge storage section along the line B-B' in the sectional view of FIG. 5 and a potential diagram in the depth direction of the cross section.

An upper portion of FIG. 9 shows a cross section of the charge storage section 3 along the line A-A' in the sectional view of FIG. 5 and a lower portion of FIG. 9 is a potential diagram in a depth direction of the cross section. An upper portion of FIG. 10 shows a cross section of the charge storage section 3 along the line B-B' in FIG. 5, and a lower portion of FIG. 10 is a potential diagram in the depth direction of the cross section. As shown in FIG. 9, by setting the gate voltage V1 to the pinning start voltage V2p or less, an interface between the n-type diffusion layer 11 with the impurity concentration of n and the gate oxide film 19 is set to the ground potential which is the same potential as that of the p-type semiconductor substrate 18. Also, as shown in FIG. 10, by setting the gate voltage V1 to the pinning start voltage V1p or less, an interface between the n-type diffusion layer 15 with the impurity concentration of n2 and the gate oxide film 19 is also set to the ground potential with the same potential as that of the p-type semiconductor substrate 18. Accordingly, by setting the gate voltage V1 to the pinning start voltage V1$p$ or less, generation of a dark current due to the interface levels in an interface between the oxide film and the silicon substrate is suppressed to about one fifth.

As described above, according to the configuration and operation of the solid-state imaging device 40 of the present embodiment, it is possible to improve transfer efficiency and reduce the dark current, by generating a fringe electric field by using a difference between two kinds of pinning potentials under one electrode.

COMPARISON EXAMPLE

Figure 1B:
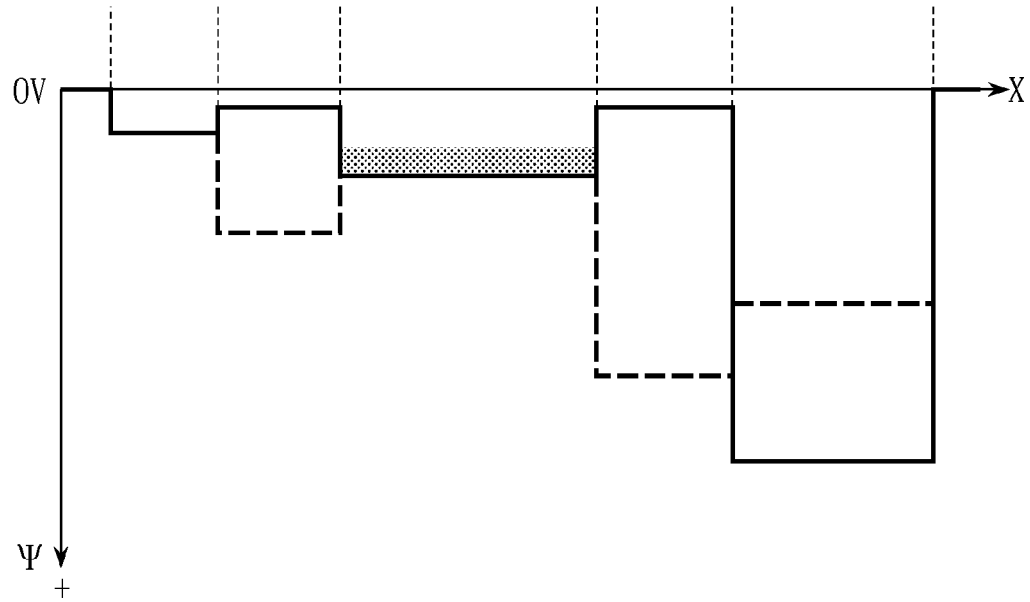
FIG. 1B is a diagram showing a transition state of potential wells in a depth direction.
Figure 2:
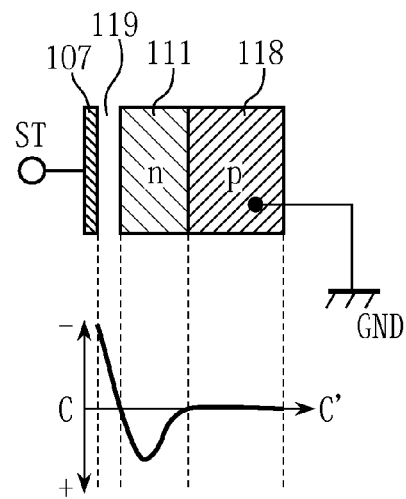
FIG. 2 shows a cross section of a charge storage section along the line C-C' shown in FIG. 1A.
Figure 3A:
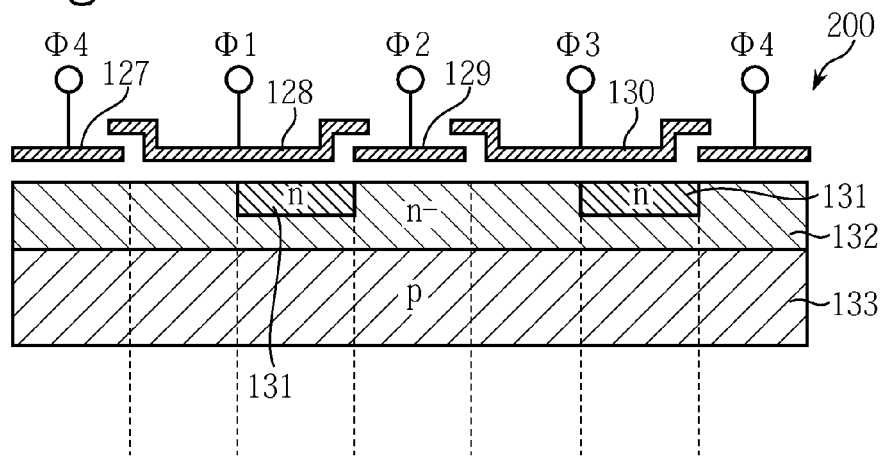
FIG. 3A is a cross sectional view showing a conventional solid-state imaging device.
Figure 3B:
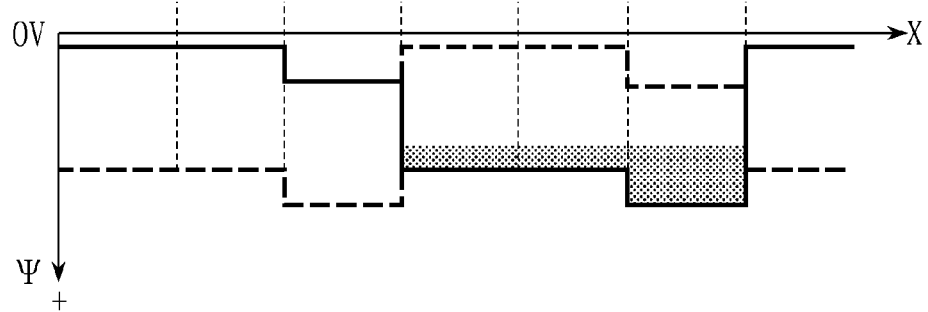
FIG. 3B shows a potential diagram under each gate electrode in the cross section of FIG. 3A.
Figure 11A:
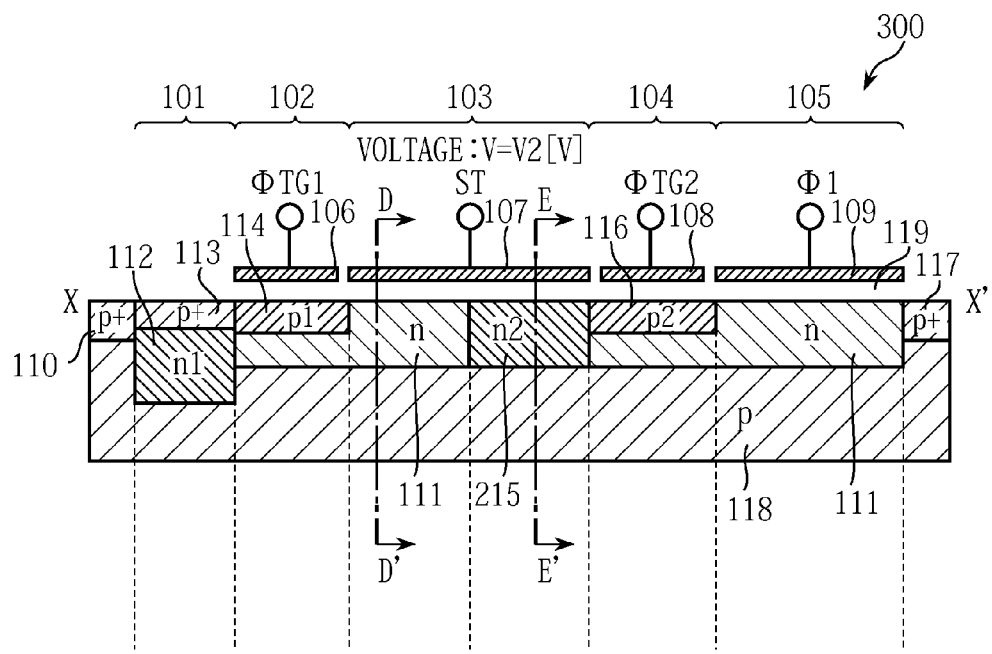
FIG. 11A shows a cross section of a solid-state imaging device showing a comparison example.
Figure 11B:
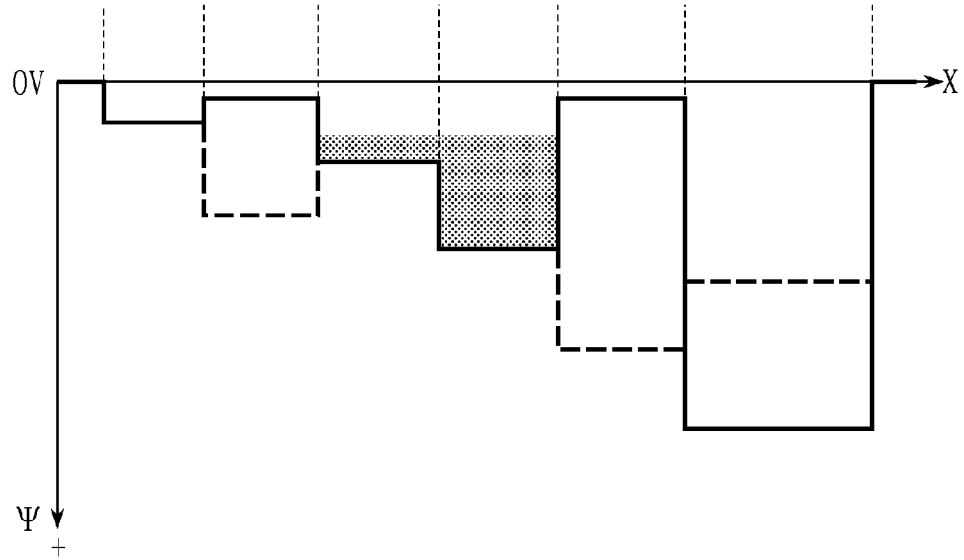
FIG. 11B shows a transition state of potential wells in the cross section of FIG. 11A.

A comparison example of the present invention will be described below. FIG. 11A shows a cross section of a solid-state imaging device 300 that shows a comparison example. FIG. 11B shows a transition state of potential wells in the cross section. A solid line and a broken line in FIG. 11B show a potential transition state in response to a voltage applied to each electrode. As shown in FIG. 11A, the solid-state imaging device 300 in the comparison example differs from the solid-state imaging device 100 shown in FIG. 1 in that an n-type diffusion layer 215 with the impurity concentration of n2 is arranged under the charge storage gate electrode 107 on the side of CCD. Here, the impurity concentration of n is assumed to be smaller than n2.

Figure 12:
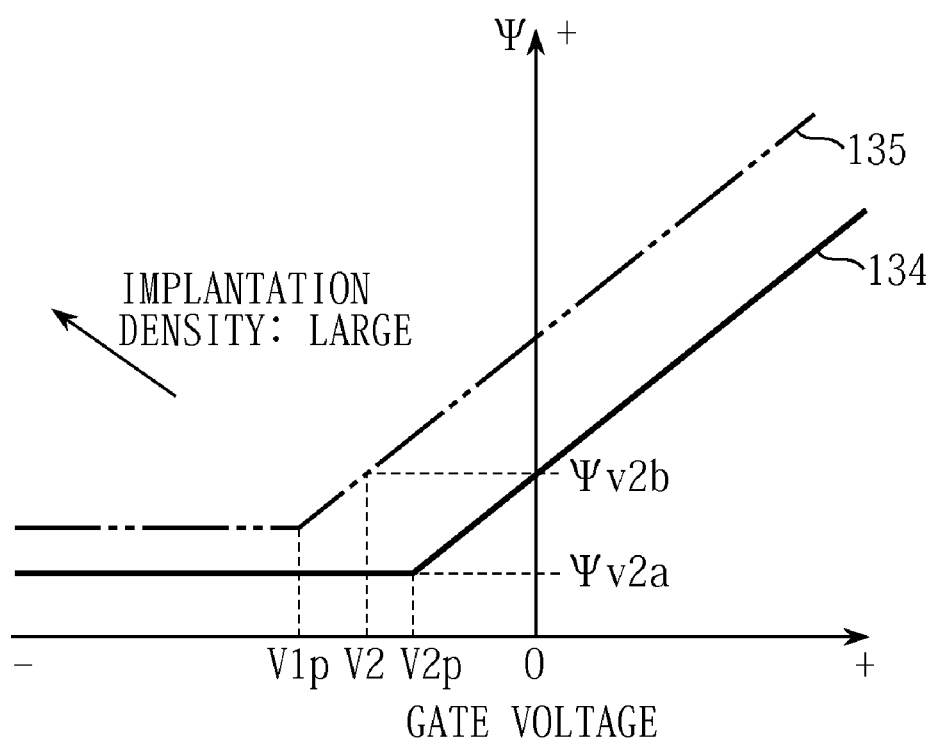
FIG. 12 is a diagram showing a channel potential characteristic at two points, where impurity concentrations are different, under the charge storage gate electrode.

FIG. 12 is a diagram showing channel potential characteristic at two points, where impurity concentrations are different, under the charge storage gate electrode 107. The channel potential characteristics corresponding to regions with the impurity concentration of n and the impurity concentration of n2 are shown by a curve 134 and a curve 135, respectively. In the curve 134, when a gate potential is V2$p$ or less, a channel potential is maintained at •v2$a$ whose is constant. This voltage is called the pinning start voltage V2$p$. The corresponding potential is also called the pinning potential •v2$a$.

In general, the pinning potential •v2$a$ is designed not to be an obstacle when charges are transferred from the photoelectric conversion section to the charge storage section 103, especially the region with the impurity concentration of n in this example, through the charge transfer gate electrode 106. Also, the DC voltage applied to the charge storage gate electrode 107 is set to the following range of:

pinning start voltage V2p to pinning start voltage (V2p-1[v]).

Here, the gate voltage of the charge storage gate electrode 107 is assumed to be the DC voltage V2. A channel potential in the curve 135 at the gate voltage V2 is •v2$b$. According to the configuration as shown in the solid-state imaging device 300 of FIGS. 11A and 11B, a following channel potential difference is observed in the vicinity of a boundary between an n-type diffusion layer 111 and the n-type diffusion layer 215 under the charge storage gate electrode 107:

channel potential difference (•v2b−•v2a)

Therefore, a transfer electric field is strengthened and transfer efficiency is improved. However, in the configuration and settings as shown in the solid-state imaging device 300, there is a case that the dark current due to the interface levels is generated.

Figure 13:
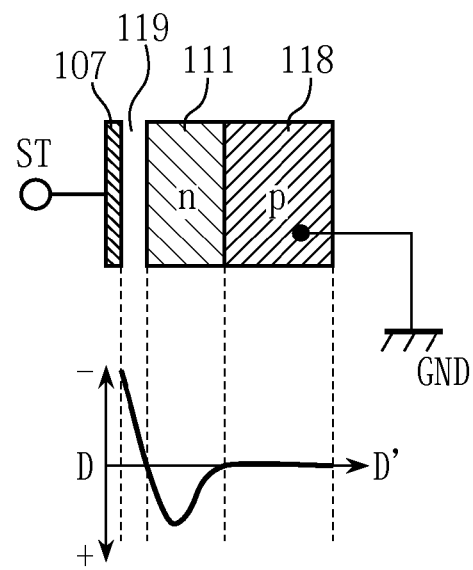
FIG. 13 shows a cross section of the solid-state imaging device along the line D-D' in the cross section of FIG. 11A, and shows a potential distribution into the depth direction when the gate voltage V2 is applied to the charge storage gate electrode.
Figure 14:
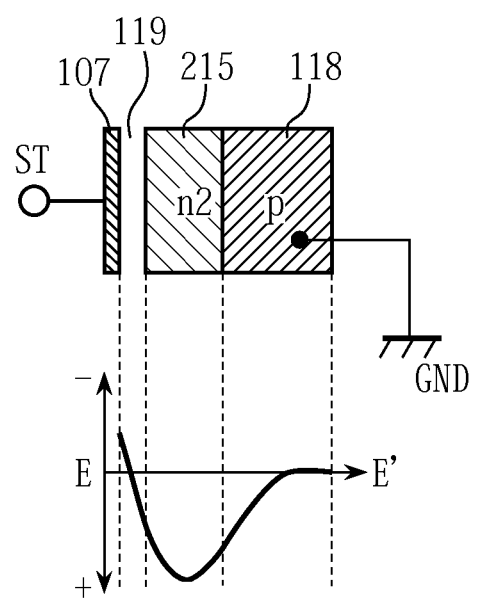
FIG. 14 shows a cross section of the solid-state imaging device along the line E-E' in the cross section of FIG. 11A, and shows a potential distribution into the depth direction when the gate voltage V2 is applied to the charge storage gate electrode.

An upper portion of FIG. 13 shows a cross section of the solid-state imaging device 300 along the line D-D' in the cross section of FIG. 11A, and a lower portion of FIG. 13 is a potential diagram showing a potential distribution into the depth direction when the gate voltage V2 is applied to the charge storage gate electrode 107. An upper portion of FIG. 14 shows a cross section of the solid-state imaging device 300 along the line E-E' in the cross section of FIG. 11A, and a lower portion of FIG. 13 is a potential diagram showing a potential distribution into the depth direction when the gate voltage V2 is applied to the charge storage gate electrode 107.

As shown in FIG. 13, the interface between n-type diffusion layer 111 and the gate oxide film 119 is set to the same ground potential as that of a p-type diffusion layer 118. Therefore, generation of the dark current due to the interface levels is suppressed in the region with the impurity concentration of n in the solid-state imaging device 300.

However, a pinning start voltage in the above curve 135 is V1$p$ and a condition of V2>V1$p$ is satisfied. Therefore, as shown in FIG. 14, the interface between the n-type diffusion layer 215 and the gate oxide film 119 is not set to the pinning state and the potential is higher than the ground potential. Accordingly, the dark current due to the interface levels will be generated.

Unlike the solid-state imaging device 300 in the comparison example, in the solid-state imaging device 40 according to the present embodiment, the regions where the impurity concentrations are different, are provided under the charge storage gate electrode, and a voltage setting range is defined so as to allow pinning in the entire regions. Thus, the charge transfer efficiency can be improved while suppressing generation of the dark current. Also, it is possible to cope with resolution improvement. In other words, in the solid-state imaging device 40 according to the present embodiment, even if the charge storage section is extended into the transfer direction for resolution improvement, a transfer electric field can be strengthened under the charge storage gate electrode and the pinning to the ground potential can be realized in an entire interface between the oxide film and the n-type diffusion layer under the charge storage gate electrode. Thus, the dark current due to the interface levels can be reduced.

[Second Embodiment]

Figure 15A:
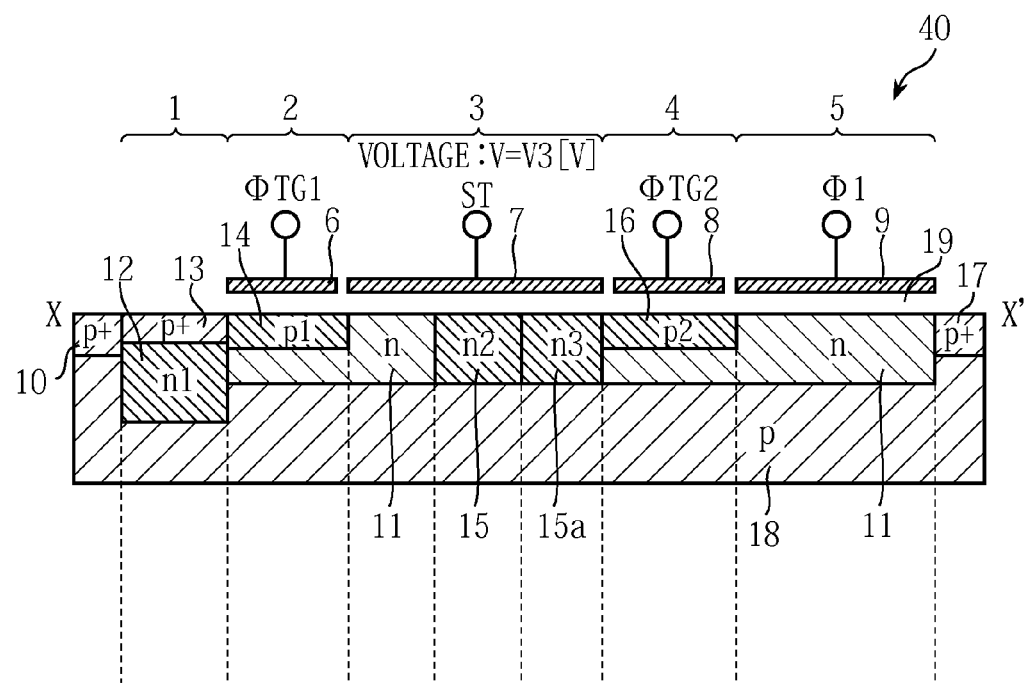
FIG. 15A shows a cross section of the solid-state imaging device according to a second embodiment of the present invention.
Figure 15B:
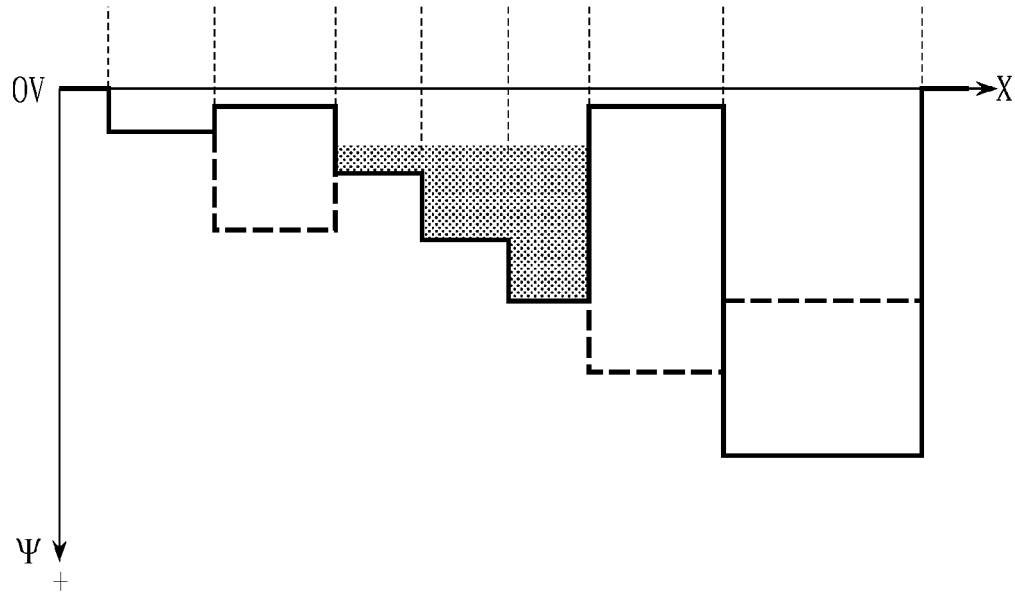
FIG. 15B shows a transition state of a potential well in the cross section of FIG. 15A.

A second embodiment of the present invention will be described below. FIG. 15A shows a cross section of the solid-state imaging device 40 according to the second embodiment. FIG. 15B shows a transition state of potential wells in the cross section. A solid line and a broken line in FIG. 15B show a potential transition state in response to a voltage applied to each of the electrodes. It should be noted that a plan view of the solid-state imaging device 40 according to the second embodiment is the same as that of the first embodiment. As shown in FIG. 15A, the solid-state imaging device 40 according to the second embodiment has three regions under the charge storage gate electrode 7: the n-type diffusion layer 11 with the impurity concentration of n, the n-type diffusion layer 15 with the impurity concentration of n2 and an n-type diffusion layer 15$a$ with the impurity concentration of n3. The n-type diffusion layer 11 is the region with the impurity concentration of n. The n-type diffusion layer 15 is the region with the impurity concentration of n2. The n-type diffusion layer 15$a$ is the region with the impurity concentration of n3. It is also assumed that, in the solid-state imaging device 40 according to the second embodiment, the following condition between impurity concentrations is satisfied:

n<n2<n3.

Here, as a method of forming the n-type diffusion layer 15 with the impurity concentration of n2 and the n-type diffusion layer 15$a$ with the impurity concentration of n3, for example, a first ion implantation is performed to form the region with the impurity concentration of n by using a mask opened in a range from the charge transfer gate section 2 to the CCD section 5. Then, a second ion implantation is additionally performed for the impurity concentration of na by using a mask opened for the n-type diffusion layer 15 and the n-type diffusion layer 15a. Then, a third ion implantation is further additionally performed for the impurity concentration of nb by using a mask opened only for the n-type diffusion layer 15a.

That is, the following relations are satisfied:

$$n2=n+na, n3=n+na+nb$$

This means a relation of n<n2<n3.

This is one example and an optional manufacturing method can be applied as long as the relation of n<n2<n3 is satisfied. The solid-state imaging device 40 according to the second embodiment operates in the same manner as the solid-state imaging device 40 according to the first embodiment.

When it is assumed that an electrode length of the charge storage gate electrode 7 shown in FIG. 15A is L, an effective gate length would be equivalent to a serial connection of three electrodes of L/3 if the n-type diffusion layer 11 with the impurity concentration of n, the n-type diffusion layer 15 with the impurity concentration of n2 and the n-type diffusion layer 15a with the impurity concentration of n3 are arranged evenly by the length of L/3. When the charge transfer is carried out entirely through diffusion, the charge transfer time will be one third in a case of existence of the n-type diffusion layer 15 with the impurity concentration of n2 and the n-type diffusion layer 15a with the impurity concentration of n3, if the charge transfer time is assumed to be 1 in a case of non-existence of the n-type diffusion layer 15 with the impurity concentration of n2 and the n-type diffusion layer 15a with the impurity concentration of n3. Also, the transfer efficiency is further improved in comparison with the solid-state imaging device 40 according to the first embodiment.

It should be noted that in practice, a fringe electric field is applied to the boundary between the n-type difference layer 11 with the impurity concentration of n and the n-type diffusion layer 15 with the impurity concentration of n2 and the boundary between the n-type diffusion layer 15 with the impurity concentration of n2 and the n-type diffusion layer 15a with the impurity concentration of n3. Therefore, it could be easily inferred that the transfer is carried out through the fringe electric field and the transfer time is further shortened. A channel potential which generates the fringe electric field will be next described.

Figure 16:
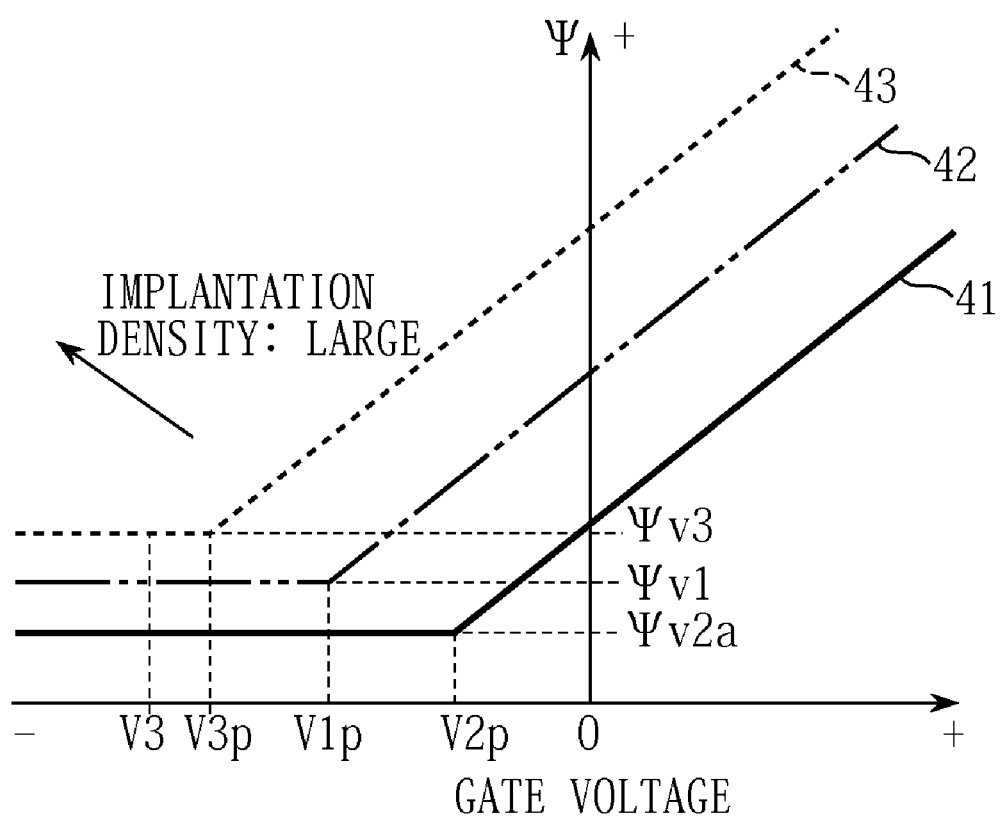
FIG. 16 is a diagram showing channel potential characteristics at three points where the impurity concentrations are different, under the charge storage gate electrode in the solid imaging device according to the second embodiment.

FIG. 16 is a diagram showing a channel potential characteristic at three points where the impurity concentrations are different, under the charge storage gate electrode 7 in the solid imaging device 40 according to the second embodiment. The channel potential characteristic of the region with the impurity concentration of n is expressed by a curve 41. The channel potential characteristic of the region with the impurity concentration of n2 is expressed by a curve 42. The channel potential characteristic of the region with the impurity concentration of n3 is expressed by a curve 43.

A pinning start voltage in the curve 41 is V2$p$. A pinning potential in the curve 41 is •v2$a$. A pinning start voltage in the curve 42 is V1$p$. A pinning potential in the curve 42 is •v1. A pinning start voltage in the curve 43 is V3$p$. A pinning potential in the curve 43 is •v3.

In the solid-state imaging device 40 according to the second embodiment, a DC voltage V3 applied to the charge storage gate electrode 7 is set to the pinning start voltage V3$p$ or less. By applying the DC voltage V3 or less to the charge storage gate electrode 7 in the solid-state imaging device 40 according to the second embodiment, a channel potential of the n-type diffusion layer 11 with the impurity concentration of n is set to the pinning potential •v2$a$. A channel potential of the n-type diffusion layer 15 with the impurity concentration of n2 is set to the pinning potential •v1. A channel potential of the n-type diffusion layer 15a with the impurity concentration of n3 is set to the pinning potential •v3.

Therefore, in the vicinity of the boundary between the n-type diffusion layer 11 with the impurity concentration of n and the n-type diffusion layer 15 with the impurity concentration of n2 under the charge storage gate electrode 7, the following channel potential difference is observed:

$$(\bullet v1 - v2a)$$

Furthermore, in the vicinity of the boundary between the n-type diffusion layer 15 with the impurity concentration of n2 and the n-type diffusion layer 15a with the impurity concentration of n3, the following channel potential difference is observed:

$$(\bullet v3 - \bullet v1)$$

Therefore, the fringe electric field is generated and the transfer efficiency is improved.

In the second embodiment as well, by setting the DC voltage V3 to the pinning start voltage V3$p$ or less so as to allow the pinning of the interface between the n-type diffusion layer 15a with highest impurity concentration and the gate oxide film 19, the interfaces between the gate oxide film 19 and the n-type diffusion layer 11 with the impurity concentration of n, the n-type diffusion layer 15 with the impurity concentration of n2 and the n-type diffusion layer 15a with the impurity concentration of n3 are entirely pinned to the ground potential. Accordingly, similar to the solid-state imaging device 40 according to the first embodiment, the dark current is suppressed to about one fifth.

[Third Embodiment]

Figure 17A:
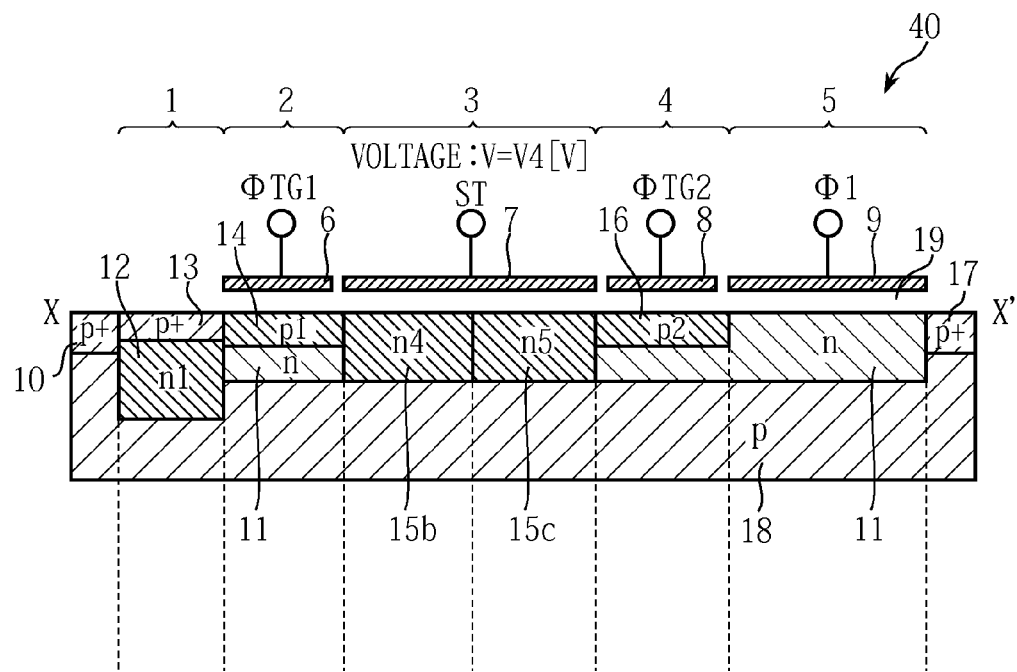
FIG. 17A shows a cross section of the solid-state imaging device 40 according to a third embodiment of the present invention.
Figure 17B:
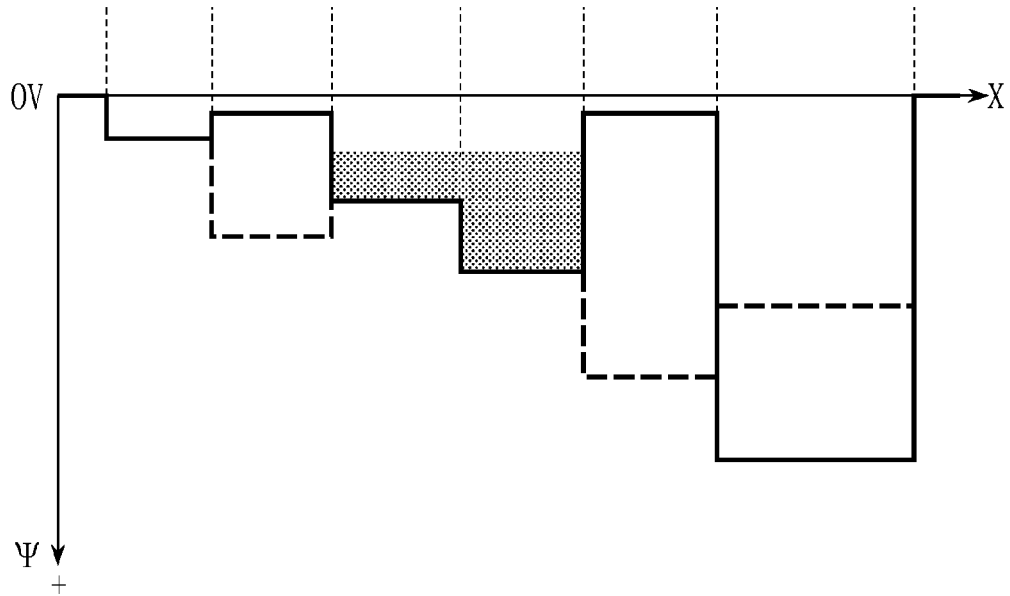
FIG. 17B shows a transition state of a potential well in the cross section of FIG. 17A.

A third embodiment of the present invention will be described below. FIG. 17A shows a cross section of the solid-state imaging device 40 according to the third embodiment. FIG. 17B shows a transition state of potential wells in the cross section. A solid line and a broken line in FIG. 17B show a potential transition state in response to a voltage applied to each of the electrodes. It should be noted that a plan view of the solid-state imaging device 40 according to the third embodiment is the same as that of the first embodiment or the second embodiment. As shown in FIG. 17A, in the solid-state imaging device 40 according to the third embodiment, two regions of an n-type diffusion layer 15b with the impurity concentration of n4 and an n-type diffusion layer 15c with the impurity concentration of n5 are formed under the charge storage gate electrode 7. It is assumed that the following condition is satisfied between the impurity concentration of n4 and the impurity concentration of n5:

$$n4 < n5.$$

Here, as a method of forming the n-type diffusion layers with the impurity concentration of n4 and the impurity concentration of n5, for example, a first ion implantation is performed to form the region with the impurity concentration of n by using a mask opened in a range from the charge transfer gate section 2 to the CCD section 5. Then, a second ion implantation is additionally performed for the impurity concentration of nc by using a mask opened in portions of the n-type diffusion layer 15b and the n-type diffusion layer 15c. A third ion implantation is further additionally performed for the impurity concentration of nd by using a mask opened only in the region of the n-type diffusion layer 15c. That is, the following relations are satisfied:

n4=n+nc, n5=n+nc+nd

This means n4<n5.
This is one example and an optional manufacturing method can be applied as long as the relation n4<n5 is satisfied.

The solid-state imaging device 40 according to the third embodiment operates in the same manner as the solid-state imaging device 40 according to the first embodiment or the second embodiment. In the first embodiment and second embodiment, the impurity concentration in the n-type diffusion layer 11 under the charge storage gate electrode 7 is the same as that of the n-type diffusion layer in the CCD section 5. In the solid-state imaging device 40 according to the third embodiment, the impurity concentration in the n-type diffusion layer under the charge storage gate electrode 7 is different from that of the CCD section 5. Therefore, the voltage under the charge storage gate electrode 7 can be controlled independently, and freedom in design is improved.

[Fourth Embodiment]

A fourth embodiment of the present invention will be described below. FIG. 18A is a cross sectional view showing the configuration of the solid-state imaging device 40 according to the fourth embodiment. FIG. 18B shows a plan view of a portion corresponding to the cross section.

Figure 19:
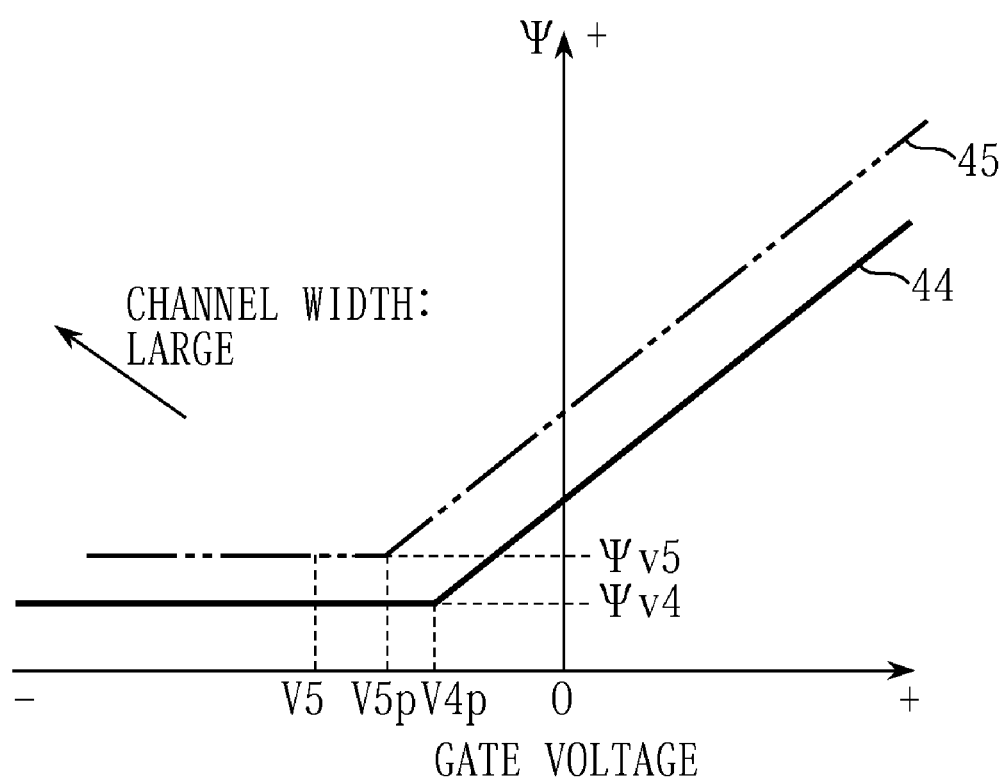
FIG. 19 is a diagram showing a channel potential characteristic at two points, where the channel widths are different, under the charge storage gate electrode.

As shown in FIG. 18B, in the solid-state imaging device 40 according to the fourth embodiment, a channel under the charge storage section 3 is formed in a taper state. FIG. 19 is a diagram showing a channel potential characteristic at two points, where the channel widths are different, under the charge storage gate electrode 7.

A curve 44 shows the channel potential characteristic of the region with a channel width W1. A curve 45 shows the channel potential characteristic of the region with a channel width W2. A pinning start voltage in the curve 44 is V4p. A pinning potential is •v4. Meanwhile, a pinning start voltage in the curve 45 is V5p. A pinning potential is •v5.

In the solid-state imaging device 40 according to the fourth embodiment, a DC voltage V5 applied to the charge storage gate electrode 7 is set to the pinning start voltage V5p or less. By applying the DC voltage V5 or less to the charge storage gate electrode 7, the channel potential in the region of the n-type diffusion layer 11 with the channel width W1 is set to the pinning potential •v4. The channel potential in the region of the n-type diffusion layer 11 with the channel width W2 is set to the pinning potential •v5. It should be noted that for easy understanding of the present invention, the fourth embodiment shows the channel widths at two points.

As shown in FIG. 18B, the solid-state imaging device 40 according to the fourth embodiment has a channel width which is gradually extended in a taper manner. Therefore, the channel potential is increased gradually in accordance with the extension. Because potential inclination is generated under the n-type diffusion layer 11 with the impurity concentration of n which is arranged under the charge storage gate electrode 7, the transfer efficiency is improved. By setting the gate electrode V5 to the pinning start voltage V5p or less, the interface between the n-type diffusion layer 11 with the impurity concentration of n and the gate oxide film 19 is subjected to the pinning to the ground potential which is the same potential as that of the p-type semiconductor substrate 18. Accordingly, generation of the dark current due to the interface levels in the interface between the gate oxide film and the silicon substrate is suppressed to about one fifth.

It should be noted that in the above embodiments, it is possible to carry out additional ion implantation of p-type impurities in a range from the charge transfer gate section 2 to the charge transfer gate section 4. It is possible to set the potential to a low level for the CCD section 5 as a whole, whereby freedom in design can be improved. The p-type semiconductor substrate in the embodiments of the present invention may be a p-well arranged in an n-type semiconductor substrate. Material used for the substrate is, for example, silicon. Any materials can be used for the gate electrodes as long as they are generally used as a gate electrode material such as polysilicon. Although all the gate electrodes have been described as a single layer, they do not need to be a single layer.

[Fifth Embodiment]

A fifth embodiment of the present invention will be described below with reference to the drawings. FIG. 20 is a plan view showing a configuration of a solid-state imaging device 40a according to the fifth embodiment of the present invention. Similar to the above solid state imaging device 40 according to the first to fourth embodiments, the solid-state imaging device 40a according to the fifth embodiment is provided with the charge transfer gate section 2 interposed between the photoelectric conversion section 1 and the charge storage section 3, and the charge transfer gate section 4 interposed between the charge storage section 3 and the CCD section 5. The CCD section 5 is also provided with a set of the CCD section gate electrode 9, the CCD section gate electrode 20, the CCD section gate electrode 25 and the CCD section gate electrode 26 for every transfer line, and the output amplifier 22 is arranged in one end of the CCD section 5. Here, the charge storage section 3 in the solid-state imaging device 40a according to the fifth embodiment has a first implantation energy n-type diffusion layer 50 and a second implantation energy n-type diffusion layer 51 to be described later, in a substrate region under the charge storage gate electrode 7.

Figure 21A:
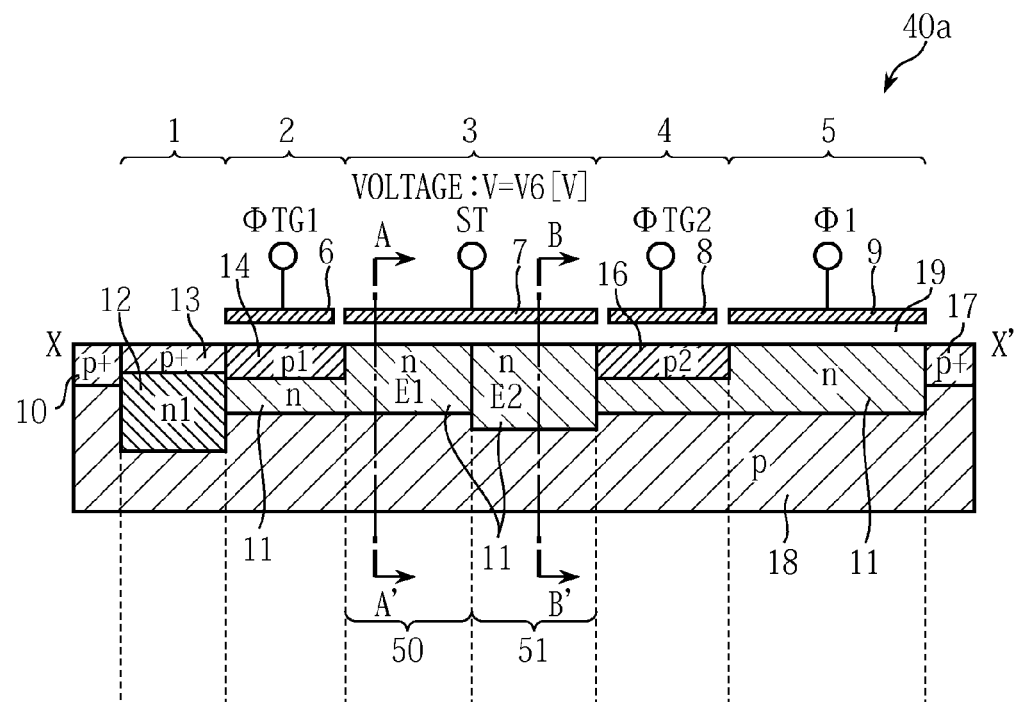
FIG. 21A shows a cross section of the solid-state imaging device according to the fifth embodiment along the line X-X' in the plan view of FIG. 20.
Figure 21B:
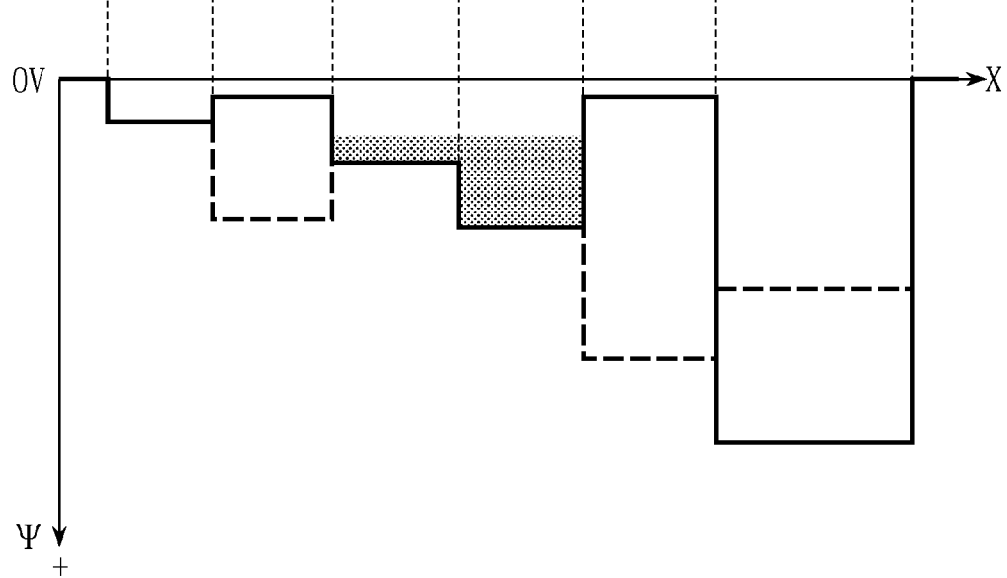
FIG. 21B shows a transition state of potential wells in the cross section of FIG. 21A.

FIG. 21A shows a cross section of the solid-state imaging device 40a according to the fifth embodiment along the line X-X' in the plan view of FIG. 20. FIG. 21B shows a transition state of potential wells in the cross section. A solid line and a broken line in FIG. 21B show a potential transition state in response to a voltage applied to each of the electrodes (in the charge transfer gate section 2, the charge transfer gate section 4 and the CCD section 5).

Referring to FIG. 21A, in the solid-state imaging device 40a according to the fifth embodiment, the n-type diffusion layer 12 with the impurity concentration of n1 is arranged in the p-type semiconductor substrate 18, and the p⁺-type diffusion layer 13 is arranged on a surface thereof. These diffusion layers constitute the photoelectric conversion section 1. The n-type diffusion layer 11 is arranged in a range from the charge transfer gate section 2 to the CCD section 5, and the p-type diffusion layer 14 with the impurity concentration of p1 is arranged under the charge transfer gate electrode 6. The p-type diffusion layer 16 with the impurity concentration of p2 is arranged under the charge transfer gate electrode 8. The gate oxide film 19 is formed between each of the gate electrodes and the silicon substrate. The p⁺-type diffusion layer 10 and the p⁺-type diffusion layer 17 are arranged respectively for element isolation on one sides of the photoelectric conversion section 1 and the CCD section 5.

A second implantation energy n-type diffusion layer 51 with the impurity concentration of n is arranged in a portion, on the side of the CCD section, of a region under the charge storage gate electrode 7. The second implantation energy n-type diffusion layer 51 is formed by performing an ion implantation with implantation energy E2. A first implantation energy n-type diffusion layer 50 with the impurity concentration of n is arranged in a portion, on the side of the photodiode, of the region under the charge storage gate electrode 7. The first implantation energy n-type diffusion layer 50 is formed by performing an ion implantation with implantation energy E1. In the solid-state imaging device 40a according to the fifth embodiment, the implantation energy E2 in forming the second implantation energy n-type diffusion layer 51 is larger than the implantation energy E1 in forming the first implantation energy n-type diffusion layer 50.

The ion implantation energy and an ion implantation amount in each of the diffusion layers are shown in the following example:

First implantation energy n-type diffusion layer 50 in the n-type diffusion layer 11: 150 keV, $2.0\times10^{12}/cm^2$
Second implantation energy n-type diffusion layer 51 in the n-type diffusion layer 11: 250 keV, $2.0\times10^{12}/cm^2$
n-type diffusion layer 12: 300 keV, $1.5\times10^{12}/cm^2$
$p^+$-type diffusion layer 13: 30 keV, $1.0\times10^{13}/cm^2$
p-type diffusion layer 14: 50 keV, $4.0\times10^{12}/cm^2$
p-type diffusion layer 16: 50 keV, $4.0\times10^{12}/cm^2$
$p^+$-type diffusion layer 10: 30 keV, $5.0\times10^{13}/cm^2$
$p^+$-type diffusion layer 17: 30 keV, $5.0\times10^{13}/cm^2$ It should be noted that the p-type semiconductor substrate 18 has an impurity concentration of about $2.0\times10^{15}/cm^3$ and the thickness of the gate oxide film 19 is in a range of about 500 to 1000•.

Also, referring to FIG. 21A, the drive pulse •TG1 is applied to the charge transfer gate electrode 6. The drive pulse •TG2 is applied to the charge transfer gate electrode 8. The drive pulse •1 is applied to the CCD section gate electrode 9. A DC voltage V6 is applied to the charge storage gate electrode 7. The p-type semiconductor substrate 18 is also set to the ground potential (not shown).

It should be noted that in the solid-state imaging device 40a shown in FIG. 21A, concentrations in the n-type diffusion layers under the region to which the drive pulse •TG1 is applied (i.e. the charge transfer gate section 2), the region to which the drive pulse •TG2 is applied (i.e. the charge transfer gate section 4), and the region to which the drive pulse •1 is applied (i.e. the CCD section 5) are the same as the n-type impurity concentration under the charge storage gate electrode 7. The above configuration is employed for easy understanding of the solid-state imaging device 40a according to the fifth embodiment. In the fifth embodiment, impurity concentration and implantation energy in these regions do not mean any relationship to the region under the charge storage gate electrode 7. It is therefore possible to enhance freedom in potential design in the solid-state imaging device 40a.

Figure 22:
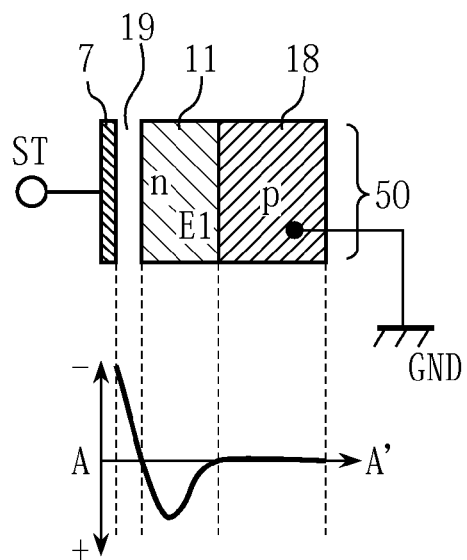
FIG. 22 shows a cross section of the first implantation energy n-type diffusion layer along the line A-A' in the sectional view of FIG. 21A in the solid-state imaging device according to the fifth embodiment and potential in the cross section.
Figure 23:
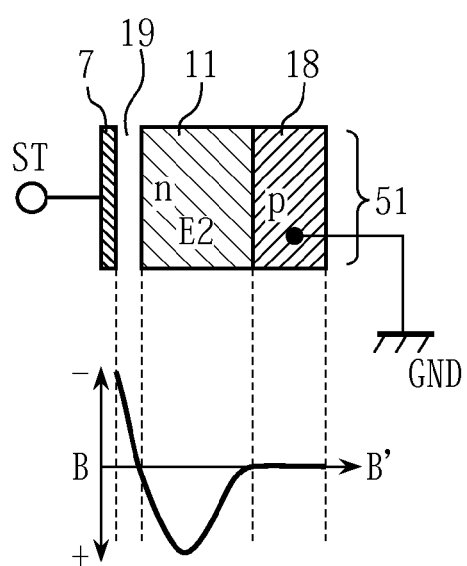
FIG. 23 shows a cross section of the second implantation energy n-type diffusion layer along the line B-B' in the sectional view of FIG. 21A in the solid-state imaging device according to the fifth embodiment and a potential in the cross section.

FIG. 22 shows a cross section of the first implantation energy n-type diffusion layer 50 in the solid-state imaging device 40a according to the fifth embodiment and a potential distribution in the cross section. FIG. 23 also shows a cross section of the second implantation energy n-type diffusion layer 51 in the solid-state imaging device 40a according to the fifth embodiment and a potential distribution in the cross section.

An upper portion of FIG. 22 shows the cross section along the line A-A' in FIG. 21A. A lower portion of FIG. 22 shows the potential distribution in the cross section. Also, an upper portion of FIG. 23 shows the cross section along the line B-B' in FIG. 21A. A lower portion of FIG. 23 shows the potential distribution in the cross section.

Both the first implantation energy n-type diffusion layer 50 and the second implantation energy n-type diffusion layer 51 are employed to set the pinning of the surface of the n-type diffusion layer 11 with the impurity concentration of n to the ground potential. Also, when implantation energies applied to form the first implantation energy n-type diffusion layer 50 and the second implantation energy n-type diffusion layer 51 are compared, the following relation of implantation energy is satisfied:

$$E1<E2.$$

Therefore, a peak potential position in the second implantation energy n-type diffusion layer 51 is deeper than a peak potential position in the first implantation energy n-type diffusion layer 50 in the depth direction. Here, charges are transferred from the first implantation energy n-type diffusion layer 50 to the second implantation energy n-type diffusion layer 51. Accordingly, the second implantation energy n-type diffusion layer 51 has a larger potential peak value than that of the first implantation energy n-type diffusion layer 50.

Figure 24:
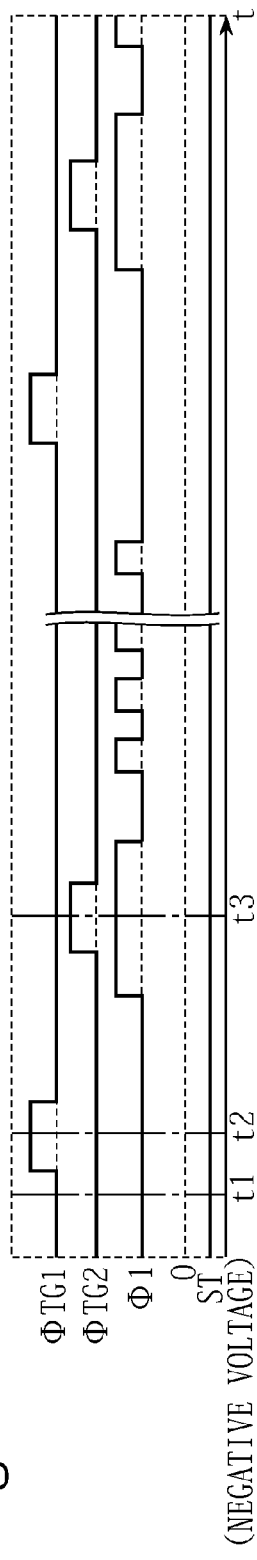
FIG. 24A shows timing charts of the operation of the solid-state imaging device according to the fifth embodiment.
FIG. 24B is a sequence diagram showing a charge transition state.

FIG. 24A shows timing charts in the operation of the solid-state imaging device 40a according to the fifth embodiment. FIG. 24B is a sequence diagram showing a charge transition state. At time t1, charges generated in the photoelectric conversion section 1 in response to incident light are stored. At time t2, •TG1 is turned on (or set to a high level). As shown in FIG. 24B, at that time, the charges generated in the photoelectric conversion section 1 are transferred to the charge storage section 3. At time t3, •TG2 is turned on (or set to the high level). As shown in FIG. 24B, at that time, the charges stored in the charge storage section 3 are transferred to the CCD section 5. Thereafter, the charges transferred to the CCD section 5 are transferred to pass through the CCD section by the two-phase drive pulses •1 and •2 and outputted from the output amplifier 22.

Applied voltages are shown in the following example:
•TG1: pulse of LOW: 0 [V] to HIGH: 5 [V]
ST: DC voltage of −10V [V]
•TG2: pulse of LOW: 0 [V] to HIGH: 10 [V]
•1: pulse of LOW: 0 [V] to HIGH: 5 [V]
•2: pulse with phase opposite to the pulse of •1

In the solid-state imaging device 40 according to the first to fourth embodiments, the transfer speed is improved by using a potential difference which is generated by carrying out selective implantation to have different impurity concentrations in regions directly under the charge storage gate electrode 7. In the solid-state imaging device 40a according to the fifth embodiment, a potential difference is achieved by changing implantation energy while maintaining the same impurity concentration of n directly under the charge storage gate electrode 7.

In the solid-state imaging device 40a according to the fifth embodiment, for example, a region on the side of the drive pulse •TG2 (i.e. second implantation energy n-type diffusion layer 51) under the charge storage gate electrode 7 is subjected to ion implantation with 250 keV, and the region on the side of the drive pulse •TG1 (i.e. first implantation energy n-type diffusion layer 50) thereunder is subjected to ion implantation with 150 keV. At this time, similar to the selective implantation of different impurity concentrations in the first to fourth embodiments, applied voltages and implantation energies for the regions under the charge storage gate electrode are set to allow the pinning of the region with the highest implantation energy (i.e. region on the side of the drive pulse •TG2). This also allows the pinning of the region on the side of the drive pulse •TG1, and the dark current problem can be solved.

In general, when entire signal charges are transferred only by thermal energy diffusion, a transfer time is in proportion to a square of a gate length of the transfer electrode. If the entire signal charges are transferred only by a fringe electric field, the transfer time is in proportion to a cube of the gate length.

In the solid-state imaging device 40a according to the fifth embodiment, when it is assumed that the gate length of the charge storage gate electrode 7 is L, an effective gate length of the charge storage gate electrode 7 will be equivalent to a serial connection of two electrodes of L/2, if the first implantation energy n-type diffusion layer 50 and the second implantation energy n-type diffusion layer 51 are arranged evenly by the length of L/2. Here, when the charge transfer is carried out entirely by diffusion, the charge transfer time in a case of existence of the second implantation energy n-type diffusion layer 51 will be ½, if the charge transfer time in the solid-state imaging device 40a in a case of non-existence of the second implantation energy n-type diffusion layer 51 under the charge storage gate electrode 7 is assumed to be 1. In practice, a fringe electric field is applied to a boundary between the first implantation energy n-type diffusion layer 50 and the second implantation energy n-type diffusion layer 51 and the transfer is carried out by the fringe electric field, which means the transfer time is further shortened.

Figure 25:
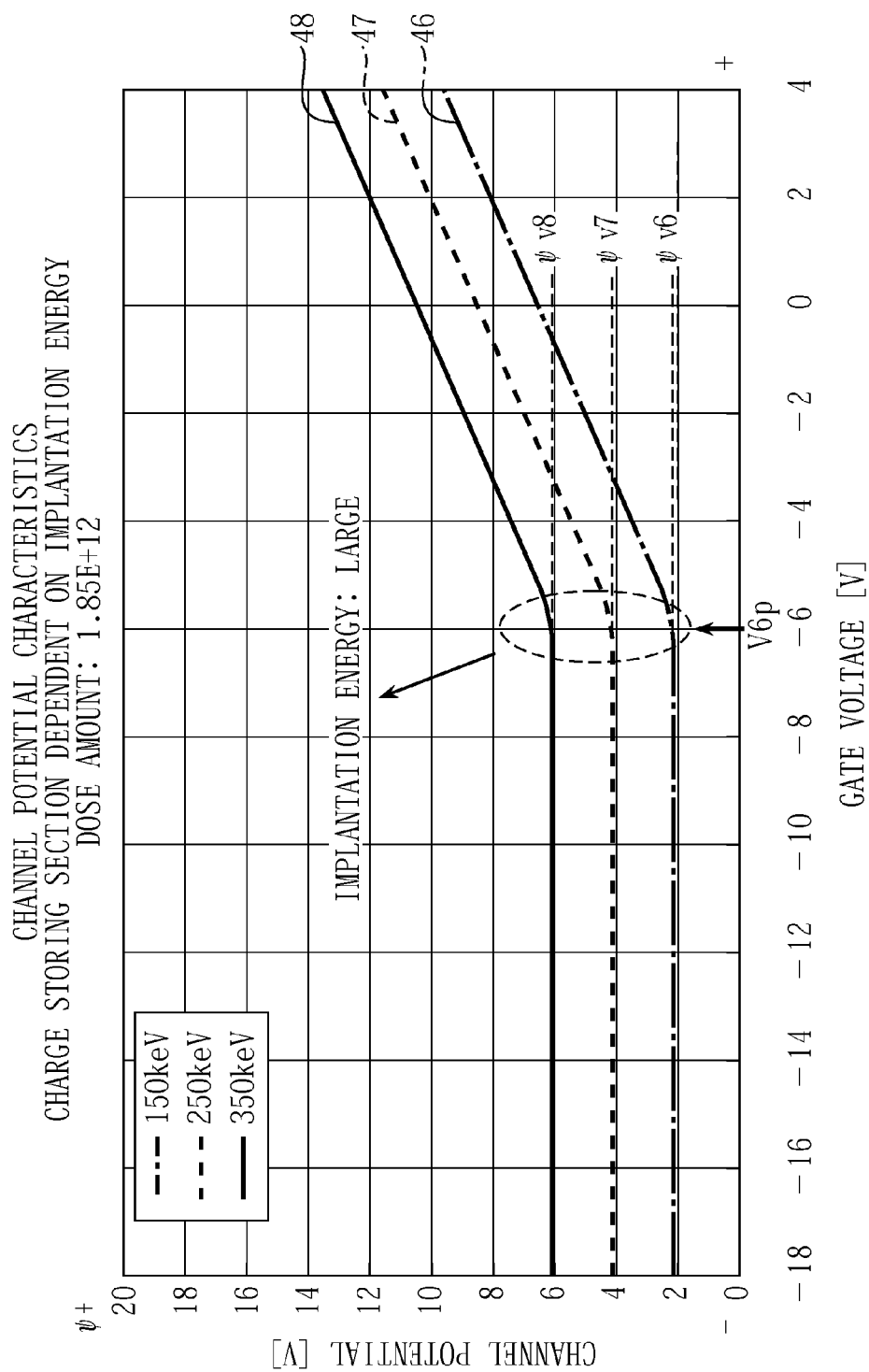
FIG. 25 is a graph showing a channel potential characteristic obtained when implantation energy is changed while maintaining a constant dose amount.

The advantageous effect of the solid-state imaging device 40a according to the fifth embodiment by using a channel potential which forms the fringe electric field will be described below. FIG. 25 is a graph showing a channel potential characteristic obtained when the implantation energy is changed while maintaining a constant dose amount. In FIG. 25, a dose amount is fixed to $1.85 \times 10^{12}/cm^2$ and implantation energy is varied among 150 keV, 250 keV and 350 keV. A curve 46 shows the channel potential characteristic obtained when the implantation energy is 150 keV. A curve 47 shows the channel potential characteristic obtained when the implantation energy is 250 keV. A curve 48 shows the channel potential characteristic obtained when the implantation energy is 350 keV. Each of them has a pinning start voltage in the vicinity of V6p. The curves also exhibit pinning potential of •v6, •v7 and •v8, respectively. It should be noted that for easy understanding of the present embodiment, the graph shown in FIG. 25 is set so that these curves have a pinning potential difference of about 2V to each other.

Here, referring to the channel potential characteristic shown in FIG. 25, the curve 46 of the channel potential characteristic, the curve 47 of the channel potential characteristic, and the curve 48 of the channel potential characteristic share substantially the same pinning start voltage V6p. Accordingly, if the solid-state imaging device 40a is formed by setting the implantation energy to 150 keV (i.e. curve 46 of channel potential characteristic) and 250 keV (i.e. curve 47 of channel potential characteristic), a voltage applied to the charge storage gate electrode can be set to −7V or the like.

In the solid-state imaging device 40a according to the present embodiment, the pinning start voltage is equal to a voltage which is obtained by adding a voltage applied to the gate oxide film to a voltage at the interface between the gate oxide film and the n-type diffusion layer under the charge storage gate electrode (i.e. ground potential). It is assumed that an electric field in the gate oxide film is Eox, a dielectric constant thereof is •ox, an electric field in a portion of the n-type diffusion layer in the boundary to the gate oxide film is Esi, and a dielectric constant thereof is •si. According to the rule that electric flux is constant at the boundary, a product of Eox and •ox is equal to a product of Esi and •si in the boundary region. Accordingly, Eox is in proportion to Esi. Since the gate oxide film has a constant electric field and the gate oxide film has a constant thickness, the pinning start voltage can be considered by replacing it with Esi. That is, as Esi becomes larger, an absolute value of the pinning start voltage becomes larger.

Firstly, when lines of electric force are considered in the region in which pinning is not caused (e.g. VG=−2V), the line of electric force starts from a donor (or positive charges) in a depletion layer, which is on the side of the gate oxide film from a peak potential position in the channel, and terminates in the gate electrode (or negative charges) to which a negative voltage is applied. A similar state can be considered until the pinning start voltage is applied, and if the gate voltage is further changed to a minus side from the pinning start voltage, negative charges, which increase accordingly in the gate electrode, are used to terminate the lines of electric force started from the positive charges that are generated for the same amount as the negative charges in the pinned interface between the gate oxide film and the semiconductor substrate. That is, the pinning start voltage is determined based on a donor amount in a depletion layer disposed on the side of the gate oxide film from the peak potential position in the channel.

Figure 26:
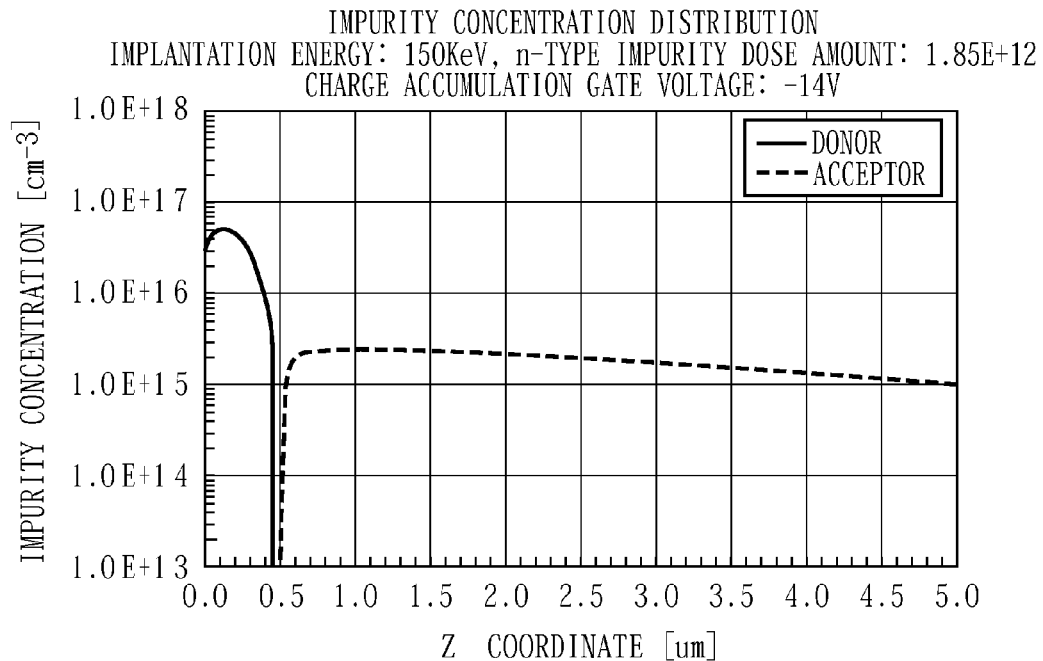
FIG. 26 shows the impurity concentration distribution obtained when the implantation energy is set to 150 keV.
Figure 27:
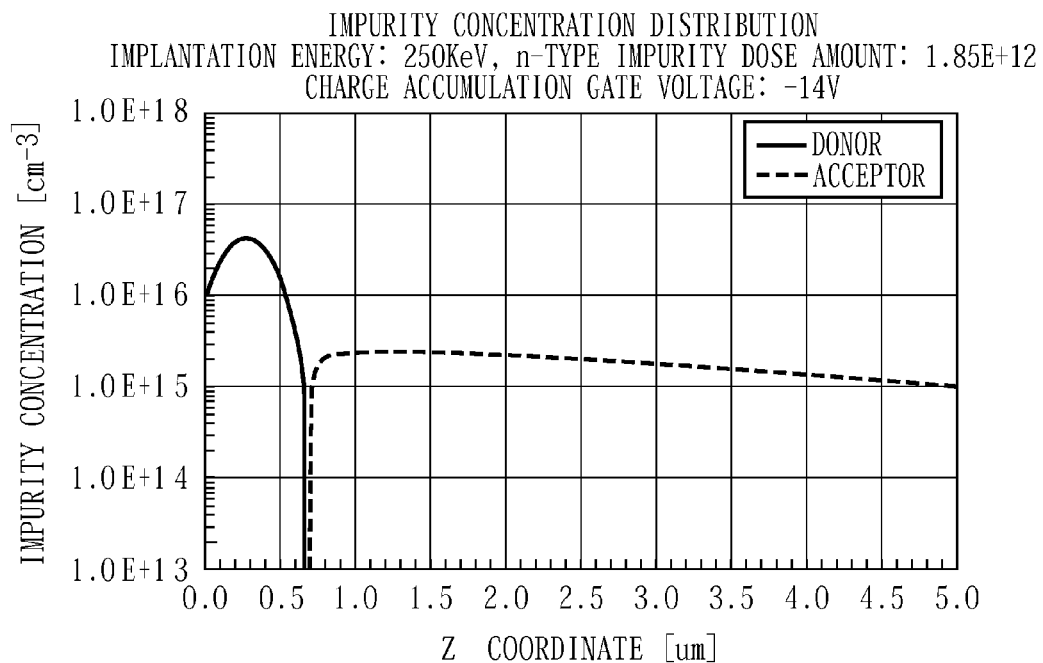
FIG. 27 shows the impurity concentration distribution obtained when the implantation energy is set to 250 keV.
Figure 28:
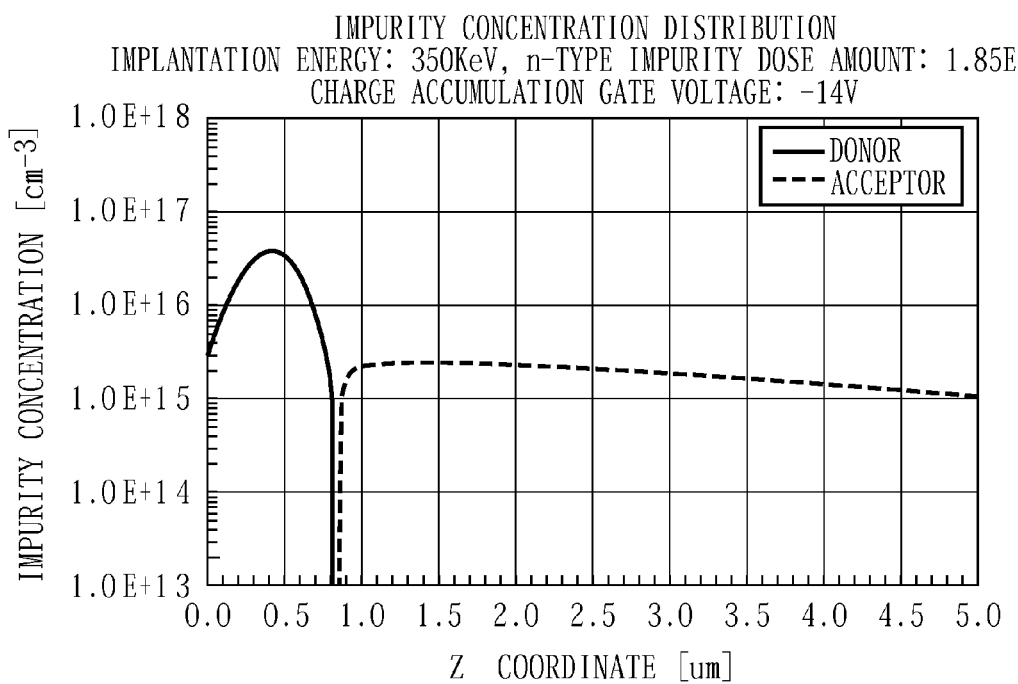
FIG. 28 shows the impurity concentration distribution obtained when the implantation energy is set to 350 keV.
Figure 29:
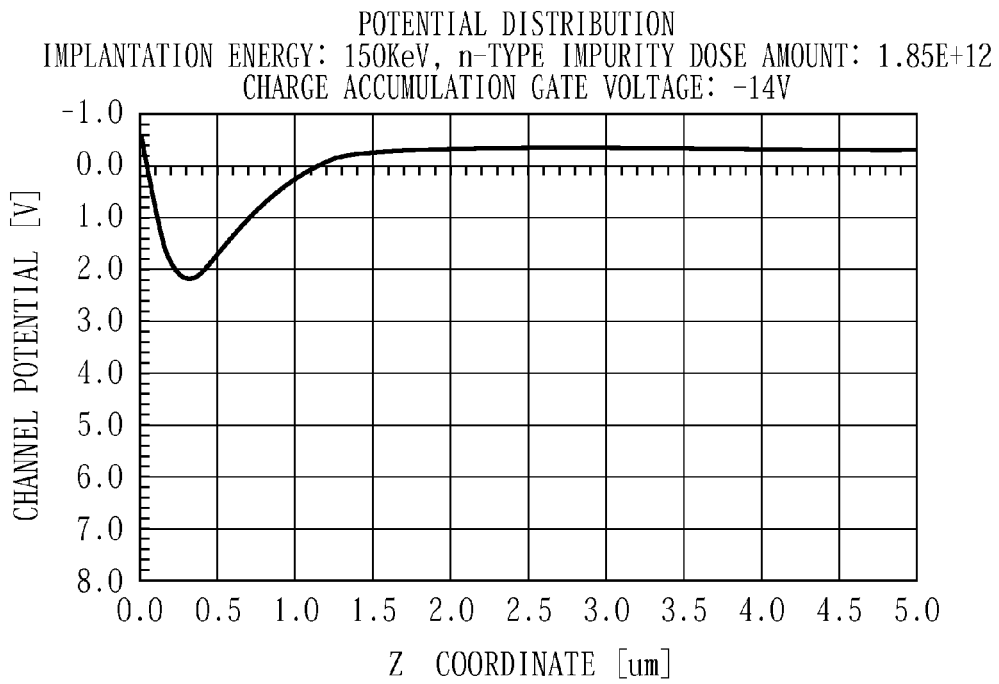
FIG. 29 shows the channel potential distribution obtained when the implantation energy is set to 150 keV.
Figure 30:
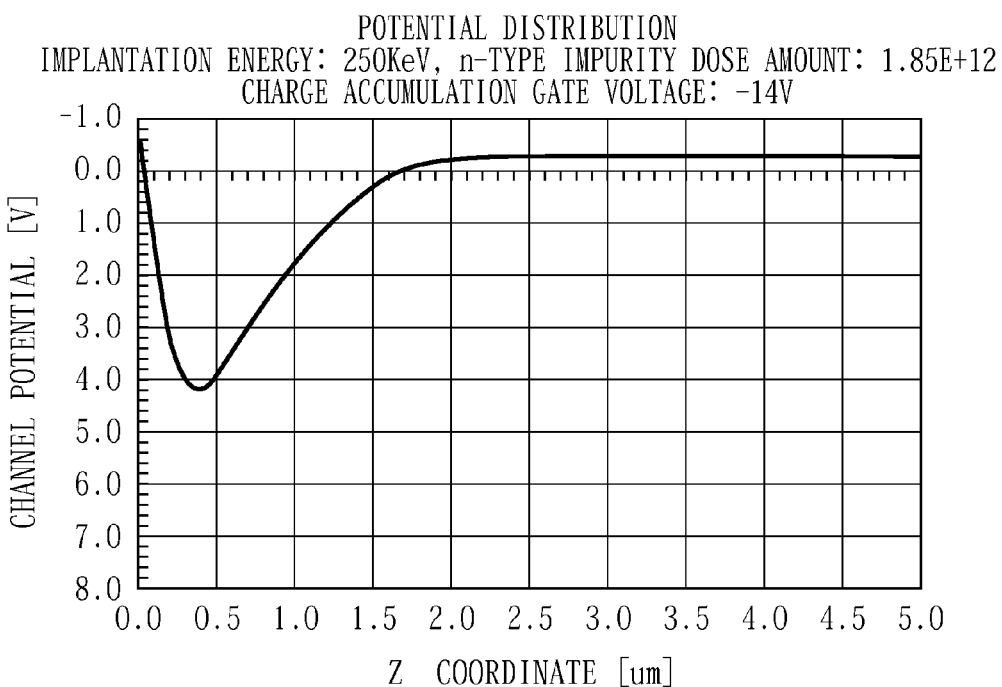
FIG. 30 shows the channel potential distribution obtained when the implantation energy is set to 250 keV.
Figure 31:
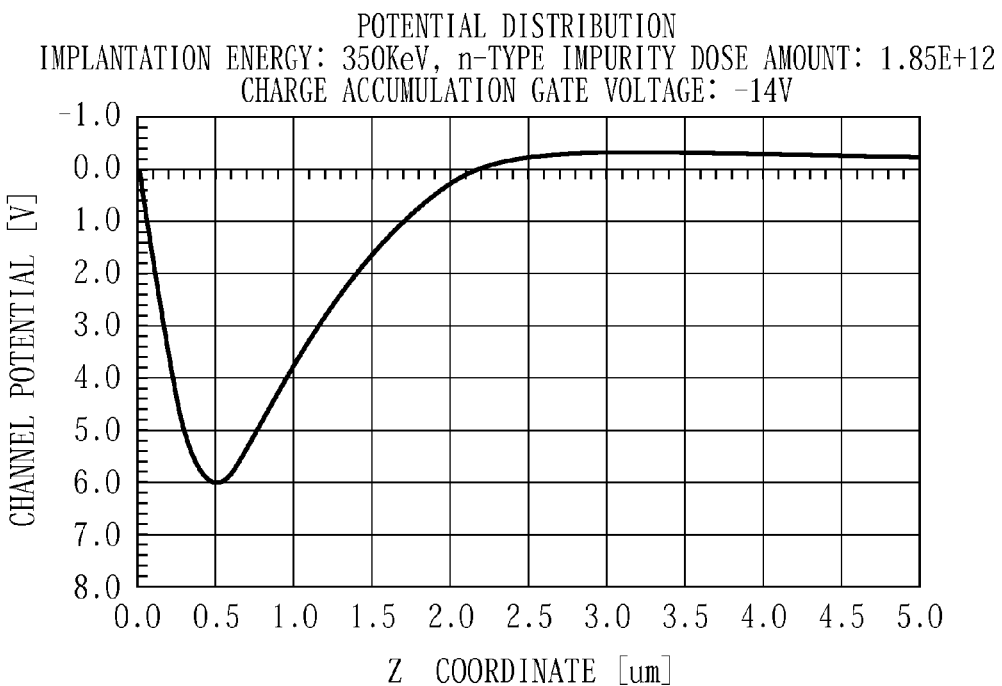
FIG. 31 shows the channel potential distribution obtained when the implantation energy is set to 350 keV.

FIGS. 26, 27 and 28 are graphs showing impurity concentration distributions (or donor and acceptor profiles) obtained when implantation energy is varied while maintaining a constant dose amount. FIG. 26 shows the impurity concentration distribution obtained when the implantation energy is set to 150 keV. FIG. 27 shows the impurity concentration distribution obtained when the implantation energy is set to 250 keV. FIG. 28 shows the impurity concentration distribution obtained when the implantation energy is set to 350 keV. In contrast, FIGS. 29, 30 and 31 are graphs showing channel potential distributions obtained when the implantation energy is varied while maintaining a constant dose amount. FIG. 29 shows the channel potential distribution obtained when the implantation energy is set to 150 keV. FIG. 30 shows the channel potential distribution obtained when the implantation energy is set to 250 keV. FIG. 31 shows the channel potential distribution obtained when the implantation energy is set to 350 keV.

As shown in FIG. 25, when the implantation energy is varied while maintaining a constant implantation dose amount, a peak potential position in the channel becomes deeper as the implantation energy becomes larger. Also, when the implantation energy is varied while maintaining the constant implantation dose amount, a channel potential becomes larger as the implantation energy becomes larger. Here, referring to FIGS. 26 to 31, with increase in implantation energy, a donor profile is extended and a peak concentration is reduced.

When the implantation energy is increased under the condition of the constant implantation dose amount, a donor amount in the semiconductor substrate is constant and a donor profile is different in extension in a depth direction of the substrate. However, in terms of a unique aspect of the pinning start voltage, the region on the side of the gate oxide film in the n-type diffusion layer and the region on the side of the p-type semiconductor substrate are both set to the ground potential, so that the amount of donors on the side of the gate oxide film from the peak potential position in channel remains substantially the same, even if the implantation energy is changed. From a different point of view, the inclination of channel potential in the vicinity of the interface of the gate oxide film (i.e. electric field Esi) remains the same even if the implantation energy is changed. Accordingly, the pinning start voltage is substantially constant even if the implantation energy is changed.

EXAMPLE

The solid-state imaging device 40a according to the fifth embodiment improves the transfer speed by a potential difference which is achieved by changing the implantation energy with the same impurity concentration of n. As stated above, in the solid-state imaging device 40 according to the first to fourth embodiments, the transfer speed is improved by a potential difference which is achieved by selective implantation with different impurity concentrations in the regions immediately under the charge storage gate electrode 7. More specifically, in the solid-state imaging device 40 according to the first to fourth embodiments, the implantation dose amount is changed while maintaining constant implantation energy. As the implantation dose amount becomes larger, the number of donors in a depleted state increases, and therefore the channel potential becomes higher. In the pinning state, the surface potential is fixed to the ground potential, whereby Esi is made larger with the increase in an implantation dose amount. A difference in the pinning start voltage between a case of changing impurity concentration and a case of changing implantation energy will be described below.

Figure 32:
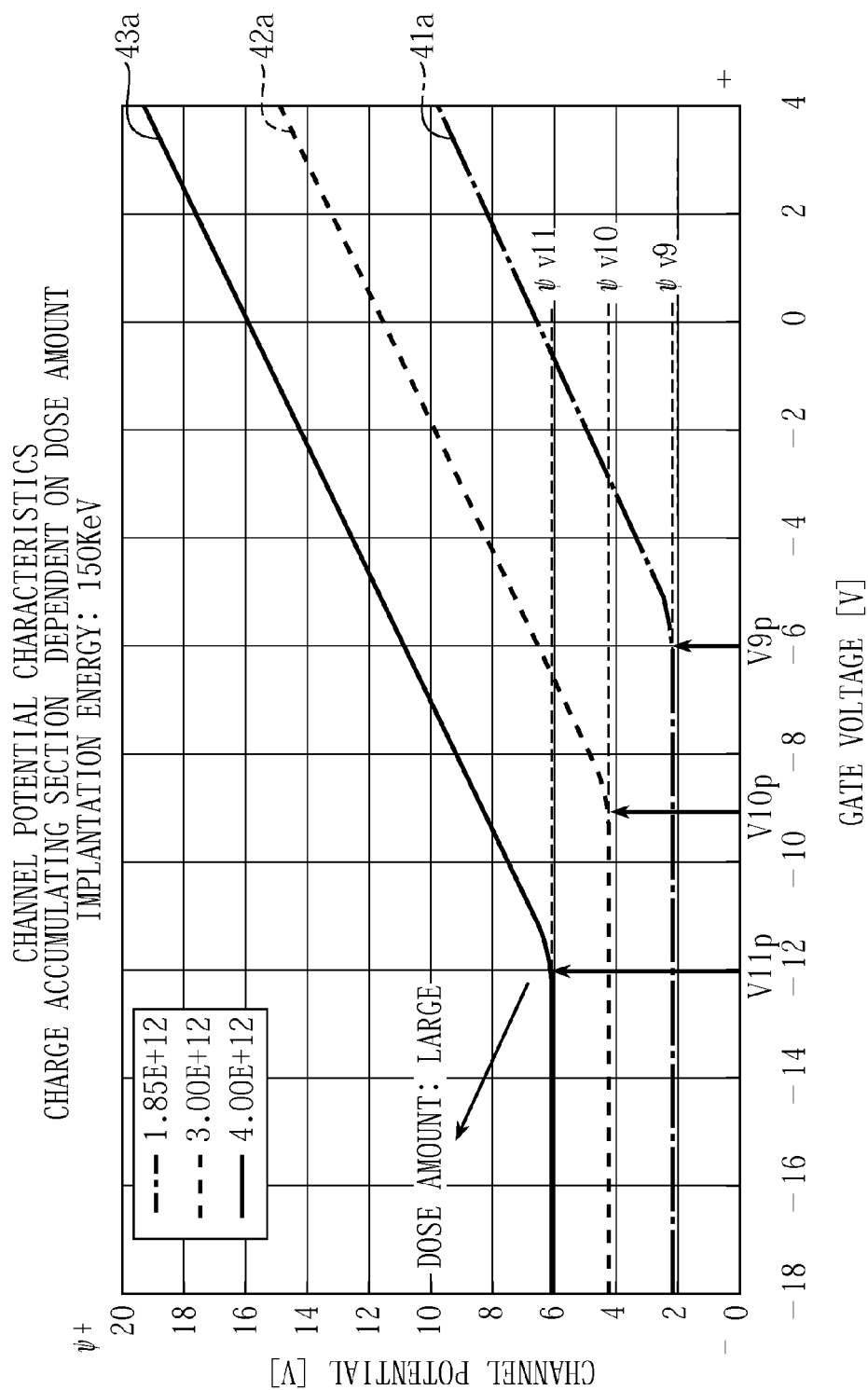
FIG. 32 is a graph showing a channel potential characteristic obtained when the dose amount is changed while maintaining the constant implantation energy.

FIG. 32 is a graph showing a channel potential characteristic obtained when the dose amount is varied while maintaining the constant implantation energy. In FIG. 32, the implantation energy is fixed to 150 keV and the implantation dose amount is varied among $1.85\times10^{12}/cm^2$, $3.00\times10^{12}/cm^2$ and $4.00\times10^{12}/cm^2$. A curve 41a shows the channel potential characteristic obtained when the dose amount is $1.85\times10^{12}/cm^2$. A curve 42a shows the channel potential characteristic obtained when the dose amount is $3.00\times10^{12}/cm^2$. A curve 43a shows the channel potential characteristic obtained when the dose amount is $4.00\times10^{12}/cm^2$. These curves exhibit the pining start voltages of V9p, V10p and V11p, respectively. They also exhibit the pinning potentials of •v9, •v10 and •v11, respectively. The graph of FIG. 32 is similar to FIG. 25 in that, for easy understanding of the present embodiment, the difference among the pinning potentials is set to about 2V.

As shown in FIG. 32, absolute values of the pinning start voltages are made larger in accordance with the relation of V9p<V10p<V11p. In the graph shown in FIG. 32, the pinning start voltage is varied by 6V from V9p to V11p for the pinning potentials of •v9, •v10 and •v11.

Figure 33:
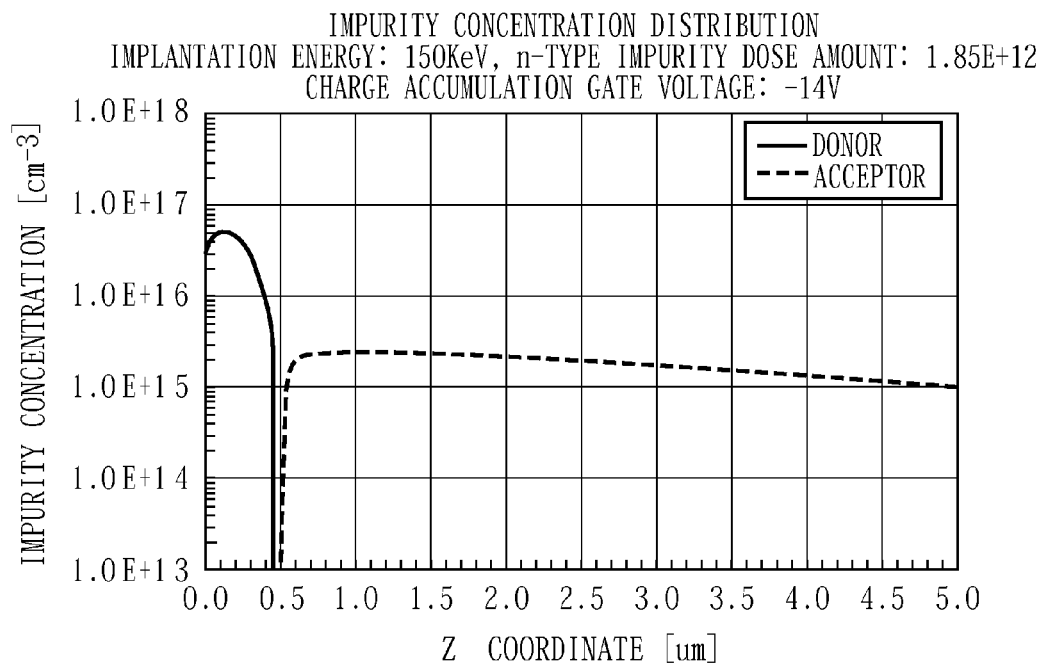
FIG. 33 shows an impurity concentration distribution obtained when the dose amount is set to $1.85 \times 10^{12}/cm^2$.
Figure 34:
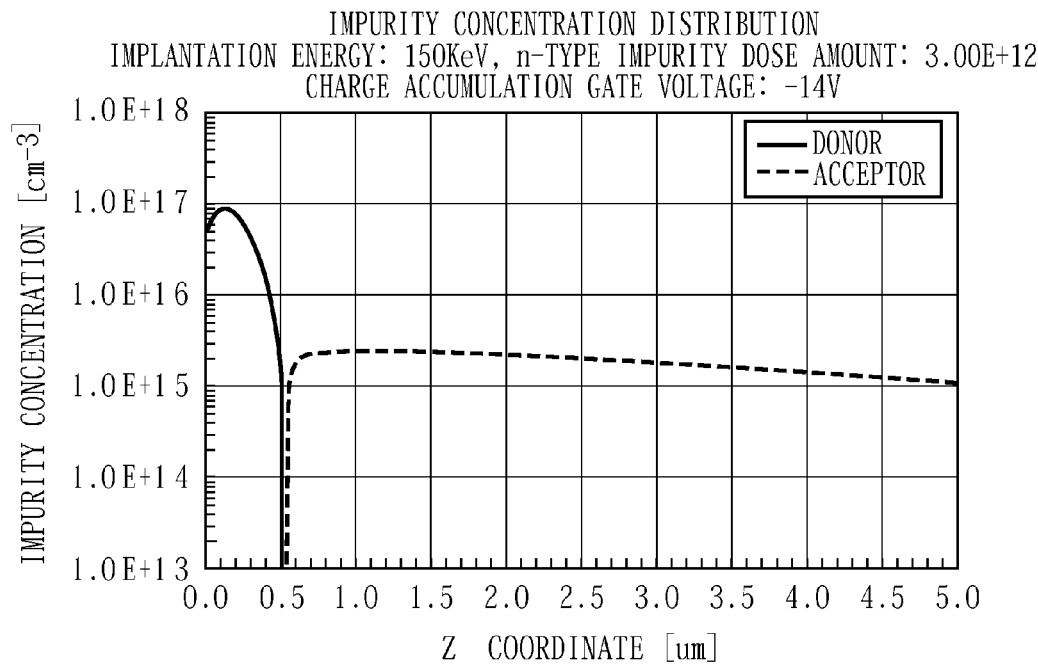
FIG. 34 shows an impurity concentration distribution obtained when the dose amount is set to $3.00 \times 10^{12}/cm^2$.
Figure 35:
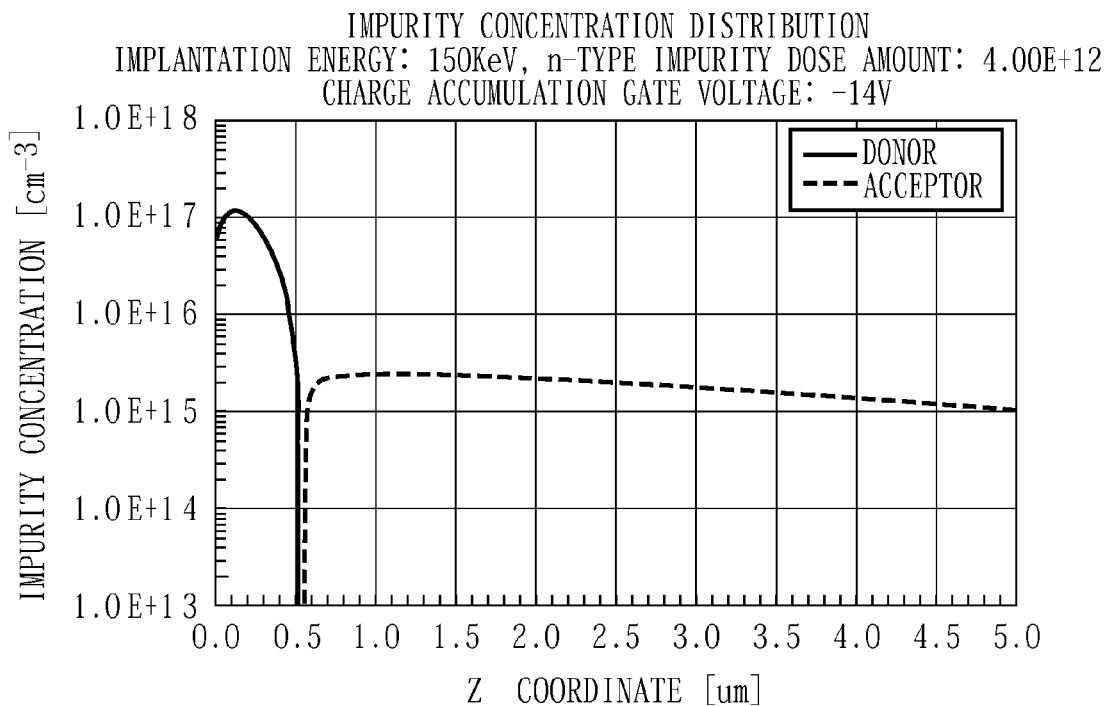
FIG. 35 shows an impurity concentration distribution obtained when the dose amount is set to $4.00 \times 10^{12}/cm^2$.
Figure 36:
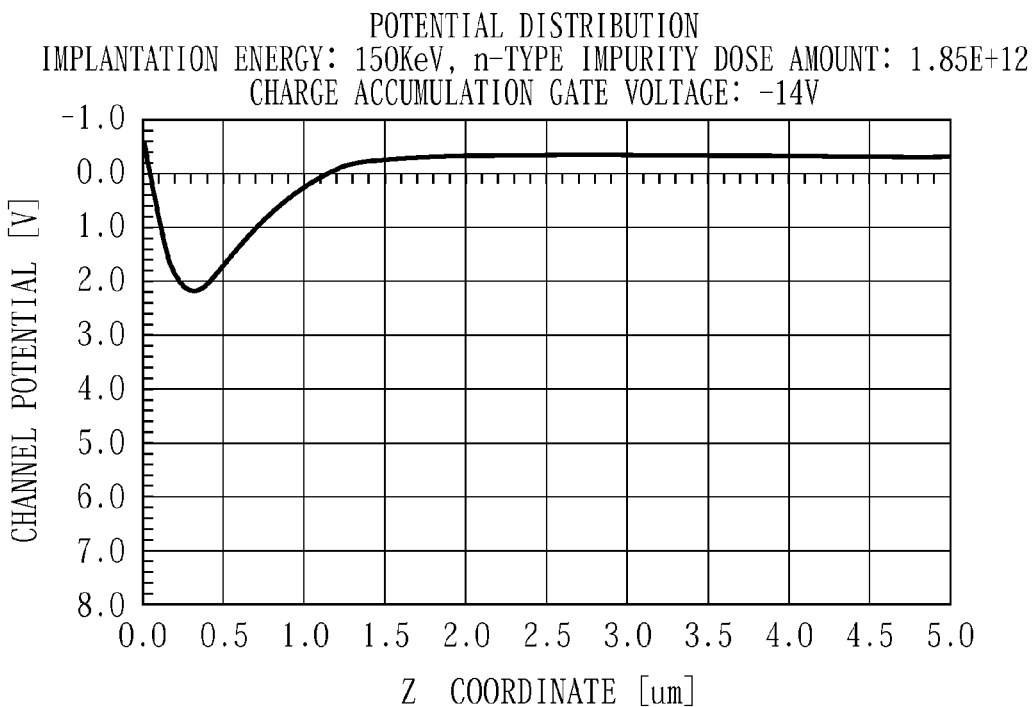
FIG. 36 shows the channel potential distribution obtained when the dose amount is set to $1.85 \times 10^{12}/cm^2$.
Figure 37:
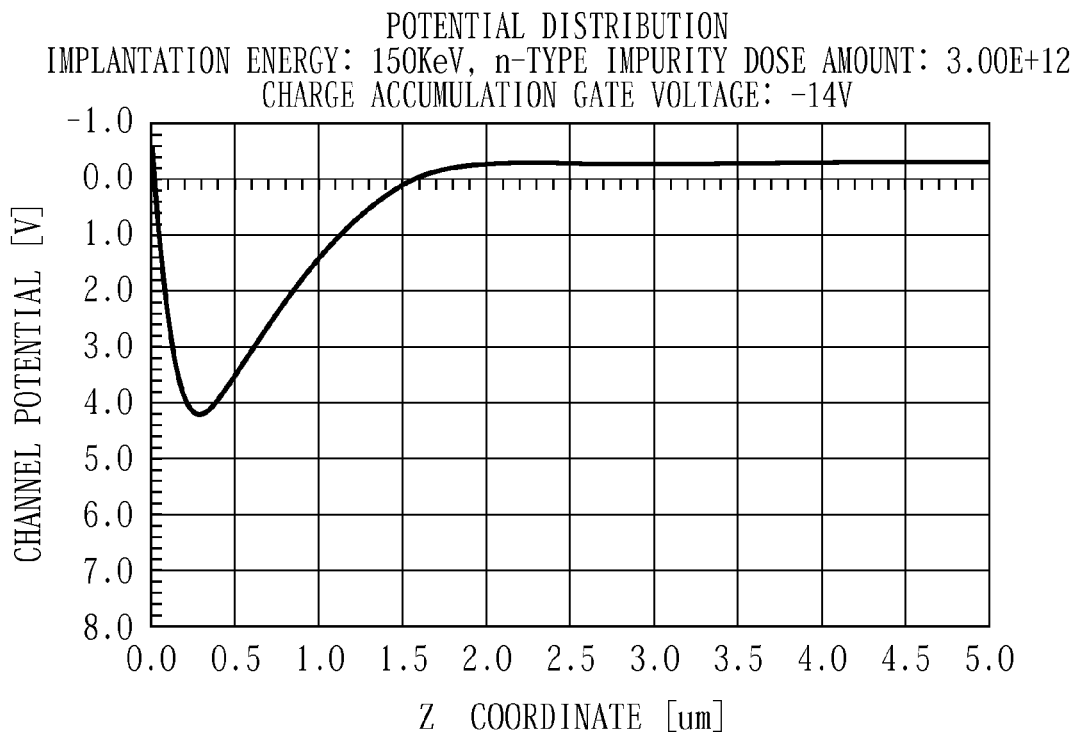
FIG. 37 shows the channel potential distribution obtained when the dose amount is set to $3.00 \times 10^{12}/cm^2$.
Figure 38:
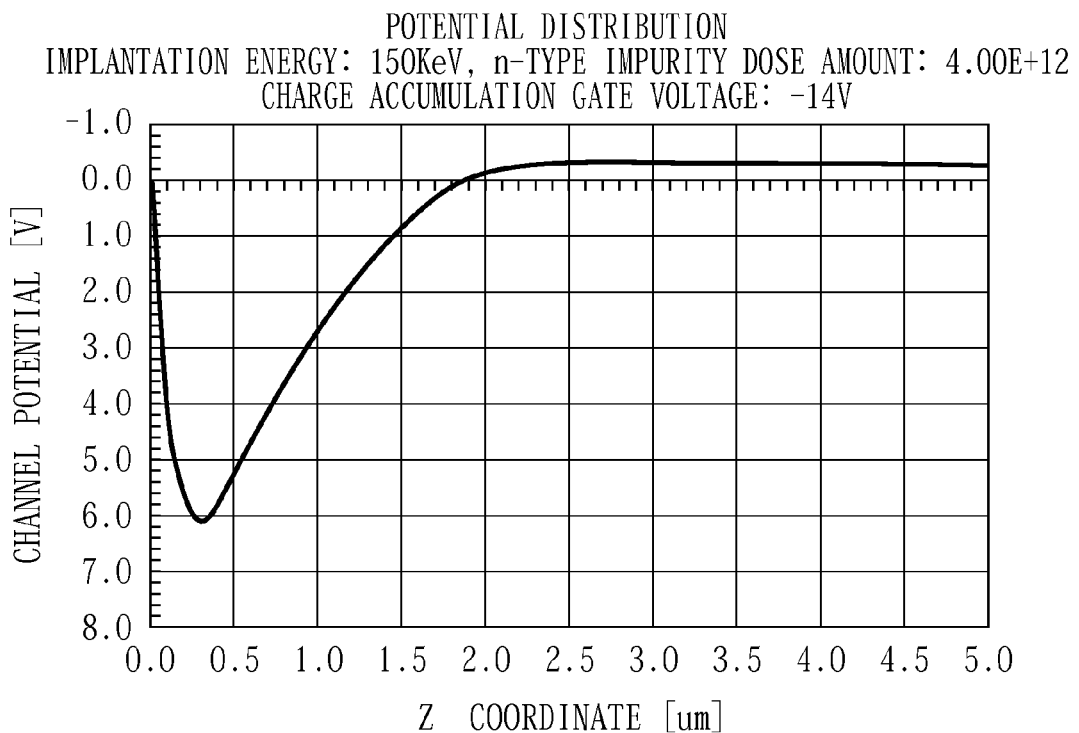
FIG. 38 shows the channel potential distribution obtained when the dose amount is set to $4.00 \times 10^{12}/cm^2$.

FIGS. 33, 34 and 35 are graphs showing impurity concentration distributions (or donor and acceptor profiles) obtained when a dose amount is varied while maintaining constant implantation energy. FIG. 33 shows the impurity concentration distribution obtained when the dose amount is set to $1.85\times10^{12}/cm^2$. FIG. 34 shows the impurity concentration distribution obtained when the dose amount is set to $3.00\times10^{12}/cm^2$. FIG. 35 shows the impurity concentration distribution obtained when the dose amount is set to $4.00\times10^{12}/cm^2$. FIGS. 36, 37 and 38 are graphs showing channel potential distributions obtained when a dose amount is varied while maintaining constant implantation energy. FIG. 36 shows the channel potential distribution obtained when the dose amount is set to $1.85\times10^{12}/cm^2$. FIG. 37 shows the channel potential distribution obtained when the dose amount is set to $3.00\times10^{12}/cm^2$. FIG. 38 shows the channel potential distribution obtained when the dose amount is set to $4.00\times10^{12}/cm^2$. As shown in FIGS. 33 to 38, it could be understood that when the dose amount is changed while maintaining the constant implantation energy, the inclination of channel potential in the vicinity of the interface of the gate oxide film (i.e. electric field Esi) becomes larger with increase in the implantation dose amount.

Referring to FIG. 32, when the dose amount is $1.85\times10^{12}/cm^2$ and the implantation energy is 150 keV, the pinning potential is about 2V. This value is considered as a voltage in the region on the side of the drive pulse •TG1 under the charge storage gate electrode 7. Next, the pinning potential in the region on the side of the drive pulse •TG2 under the charge storage gate electrode 7 is set to about 4V to generate a potential difference immediately under the charge storage electrode 7 so as to improve transfer speed.

In a case of changing the impurity concentration based on the graph shown in FIG. 32, the n-type diffusion layer 15 with the impurity concentration of n2 may be formed under the settings of $3.00\times10^{12}/cm^2$ and 150 keV. In this case, in order to allow the pinning under the charge storage gate electrode 7 in the solid-state imaging device 40, it is necessary to set a voltage applied to the charge storage gate electrode to V10p or less, e.g. about −10V or less. In contrast, in a case of changing the implantation energy as shown in FIG. 25, the second implantation energy n-type diffusion layer 51 may be formed under the settings of $1.85\times10^{12}/cm^2$ and 250 keV. In this case, in order to allow the pinning under the charge storage gate electrode 7, a voltage applied to the charge storage gate electrode 7 may be set to V6p or less, or about −7V or less.

In generating the channel potential difference of about 2V immediately under the charge storage gate electrode 7, between a case of regions formed with different implantation energies and a case of regions formed with different impurity concentrations, the following pinning start voltage difference is observed:

(−7V)−(−10V)=3V

By providing the regions in which the implantation energy is different, it is possible to form the solid-state imaging device 40a with a small difference in the pinning start voltage. It is also possible to form the solid-state imaging device 40a in which the charge storage gate electrode 7 has a pinning start voltage whose value is set to be larger to a plus side.

When the above pinning operation is carried out, a minus voltage is applied to the charge storage gate electrode 7 so that a plus voltage is generated immediately under the charge storage gate electrode 7, whereby plus voltages are supplied as the drive pulse •TG1 for the charge transfer gate electrode 6 adjacent to the charge storage gate electrode 7, and as the drive pulse •TG2 for the charge transfer gate electrode 8 adjacent thereto. Such a voltage arrangement affects a breakdown voltage between the charge storage gate electrode 7 and the substrate, a breakdown voltage between the charge storage gate electrode 7 and the charge transfer gate electrode 6 to which the drive pulse •TG1 is supplied, and a breakdown voltage between the charge storage gate electrode 7 and the charge transfer gate electrode 8 to which the drive pulse •TG2 is supplied. As shown in the fifth embodiment, according to the solid-state imaging device 40a configured by turning the pinning start voltage to a plus side and realizing a small variation in the pinning start voltage, performance for breakdown voltage can be improved, resulting in improvement of product reliability.

In addition, similar to the solid-state imaging device 40 according to the first to fourth embodiments, by setting a voltage applied to the charge storage gate electrode to a pinning start voltage or less, a potential in the interface between the first implantation energy n-type diffusion layer 50 and the gate oxide film 19 and a potential in the interface between the second implantation energy n-type diffusion layer 51 and the gate oxide film 19 are both set to the ground potential which is the same potential as that of the p-type semiconductor substrate 18. Accordingly, generation of the dark current due to interface levels in the interface between the gate oxide film and the silicon substrate is suppressed to about one fifth. As stated above, according to the configuration and driving method as shown in the solid-state imaging device 40a according to the fifth embodiment, a fringe electric field is generated by using a difference between two kinds of pinning potentials under one electrode, thereby improvement of transfer efficiency and reduction of the dark current are attained.

[Sixth Embodiment]

Figure 39A:
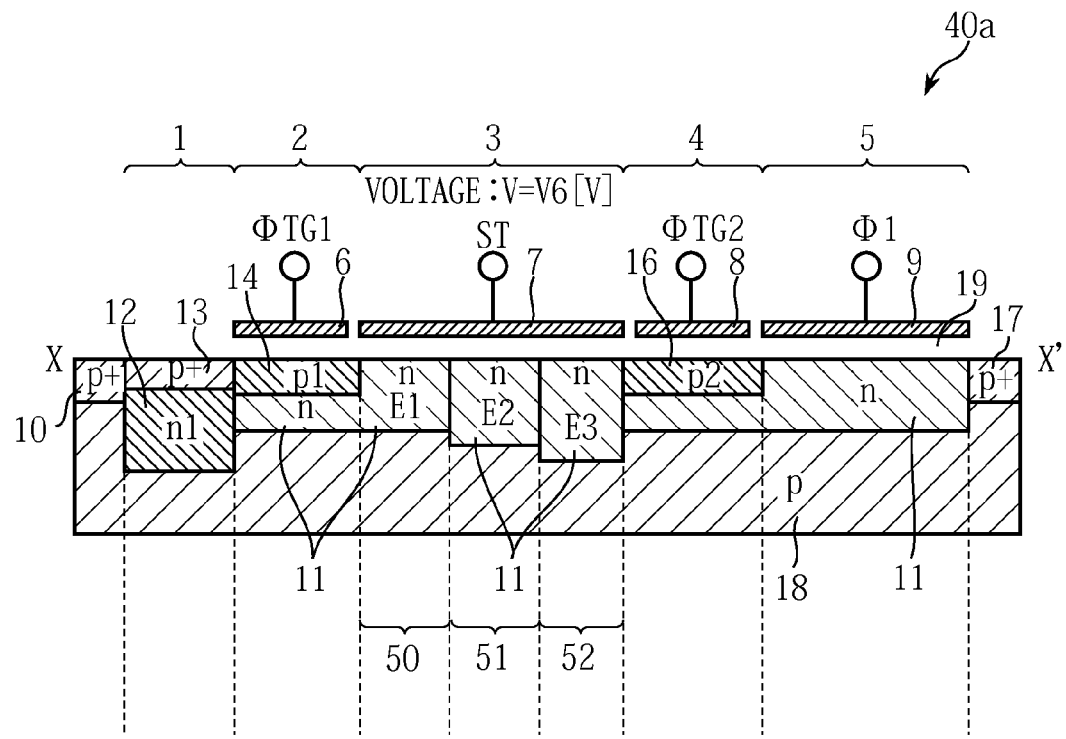
FIG. 39A shows a cross section of the solid-state imaging device according to a sixth embodiment of the present invention.
Figure 39B:
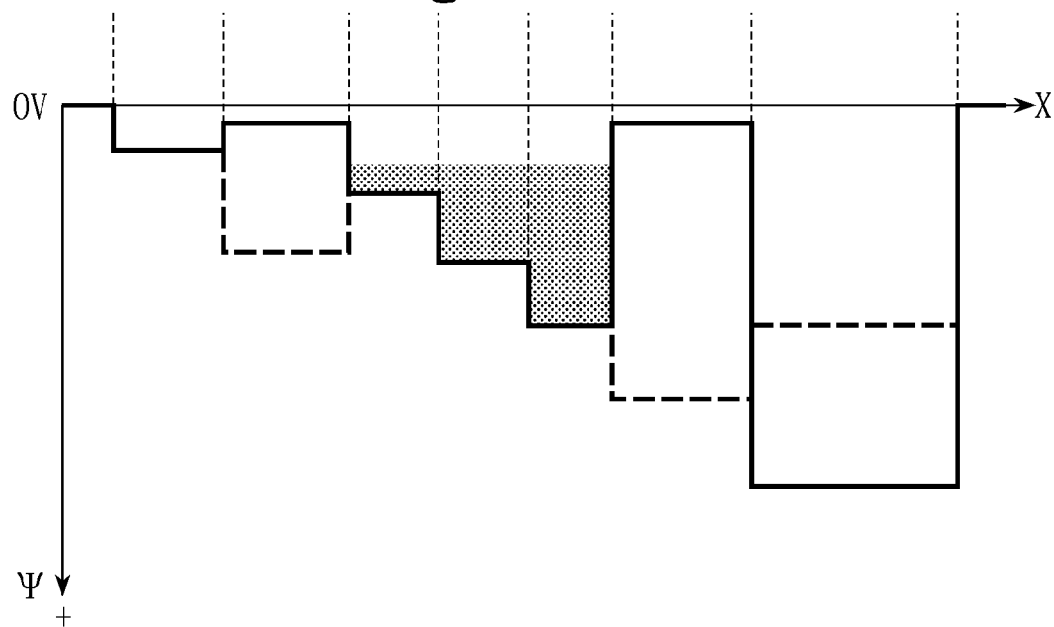
FIG. 39B shows a transition state of potential wells in the cross section of FIG. 39A.

Referring to the drawings, a sixth embodiment of the present invention will be described below. FIG. 39A shows a cross section of the solid-state imaging device 40a according to the sixth embodiment. FIG. 39B shows a transition state of potential wells in the cross section. A solid line and a broken line in FIG. 39B show a potential transition state in response to a voltage applied to each of the electrodes (in the charge transfer gate section 2, the charge transfer gate section 4 and the CCD section 5). It should be noted that a plan view of the solid-state imaging device 40a according to the sixth embodiment is the same as that of the fifth embodiment.

Referring to FIG. 39A, the solid-state imaging device 40a according to the sixth embodiment is provided with a first implantation energy n-type diffusion layer 50, a second implantation energy n-type diffusion layer 51 and a third implantation energy n-type diffusion layer 52 under the charge storage gate electrode 7. The first implantation energy n-type diffusion layer 50, the second implantation energy n-type diffusion layer 51 and the third implantation energy n-type diffusion layer 52 are formed to have the same impurity concentration with the different implantation energies of E1, E2 and E3, respectively. The components other than the above-mentioned components are the same as those of the solid-state imaging device 40a according to the fifth embodiment. Here, the implantation energy has the following relation of E1<E2<E3.

In the solid-state imaging device 40a according to the sixth embodiment, FIG. 39 shows, for easy understanding of the present embodiment, each of the n-type diffusion layer under the charge transfer gate electrode 6 which receives the drive pulse •TG1, the n-type diffusion layer under the charge transfer gate electrode 8 which receives the drive pulse •TG2 and the n-type diffusion layer under the CCD section gate electrode 9 which receives the drive pulse •1 is formed to have the same concentration of n as those of the n-type diffusion layers under the charge storage gate electrode 7. The solid-state imaging device 40a according to the present embodiment is not limited to such a configuration. In the present embodiment, in order to allow freedom in potential design, impurity concentrations and implantation energy for these regions may not necessarily need to have a relation to those under the charge storage gate electrode 7.

Specific descriptions of the embodiments of the present invention have been made. The present invention is not limited to the above embodiments and can be changed variously in a range without going beyond the gist thereof. The above embodiments can also be executed in combination in a range without having contradictions in the configuration and operation thereof.

What is claimed is:

1. A solid-state imaging device comprising:
  a photoelectric converting section comprising a photo-diode;
  a charge storage section;
  a charge transfer section;
  a first control gate section provided between said photoelectric converting section and said charge storage section to control transfer of a signal charge from said photoelectric converting section to said charge storage section; and
  a second control gate section provided between said charge storage section and said charge transfer section to control the transfer of said signal charge from said charge storage section to said charge transfer section,
  wherein said charge storage section comprises:
    a first region formed on a side near said first control gate section; and
    a second region formed on a side near said second control gate section and configured to have a channel potential increased more than that of said first region, and
  wherein said second region is configured to hold said signal charge in a pinning condition.

2. The solid-state imaging device according to claim 1, wherein said first region has a first impurity concentration, and said second region has a second impurity concentration which is higher than that of said first impurity concentration, and
  wherein a gate voltage equal to or lower than a pinning start voltage of said second region is applied to a charge storage gate electrode provided for said charge storage section.

3. The solid-state imaging device according to claim 2, wherein the first impurity concentration of said first region is higher than an impurity concentration in said charge transfer section.

4. The solid-state imaging device according to claim 3, wherein a pinning start voltage of said first region is higher than that of said second region, and a pinning potential of said first region is lower than that of said second region.

5. The solid-state imaging device according to claim 2, wherein said first region has a first channel length, and said second region has a second channel length which is substantially equal to said first channel length.

6. The solid-state imaging device according to claim 1, wherein said charge storage section further comprises a third region formed between said second region and said second control gate section,
  wherein said third region is configured to have a channel potential increased more than that of said second region, and
  wherein said first region, said second region and said third region are configured to hold said signal charge in the pinning condition.

7. The solid-state imaging device according to claim 6, wherein said first region has a first channel length, said second region has a second channel length, and said third region has a third channel length, wherein said first to third channel lengths are substantially equal to each other, and
  wherein a gate voltage equal to or lower than a pinning start voltage of said third region is applied to a charge storage gate electrode provided for said charge storage section.

8. The solid-state imaging device according to claim 6, wherein a pinning start voltage of said first region is higher than that of said second region, and the pinning start voltage of said second region is higher than that of said third region, and
  wherein a pinning potential of said first region is lower than that of said second region, and the pinning potential of said second region is lower than that of said third region.

9. The solid-state imaging device according to claim 1, wherein said charge storage section has said channel width increasing monotonously from a boundary with said first control gate section to a boundary with said second control gate section.

10. The solid-state imaging device according to claim 1, wherein each of said first region and said second region is provided in a substrate,
   wherein said charge storage section further comprises:
   an insulating film provided on said substrate; and
   a charge storage gate electrode provided over said first and second region intervened by said insulating film,
   wherein said first region has a first depth, and said second region has a second depth which is deeper than the first depth,
   wherein said first region has a first interface impurity concentration at an interface between said insulating film and said first region, said second region has a second interface impurity concentration at an interface between said insulating film and said second region, and said second interface impurity concentration is lower than said first interface impurity concentration, and
   wherein a gate voltage equal to or lower than a pinning start voltage of said second region is applied to said charge storage gate electrode.

11. The solid-state imaging device according to claim 10, wherein said first region has a first impurity concentration distribution profile in which a maximum impurity concentration is at a first peak concentration depth from said interface, and
   wherein said second region has a second impurity concentration distribution profile in which a maximum impurity concentration is at a second peak concentration depth which is deeper than said first peak concentration depth.

12. The solid-state imaging device according to claim 11, wherein said first region has a first channel length, and said second region has a second channel length which is substantially equal to said first channel length.

13. The solid-state imaging device according to claim 11, wherein a pinning start voltage of said first region and a pinning start voltage of said second region are substantially equal to each other, and
   wherein a pinning potential of said first region is lower than that of said second region.

14. The solid-state imaging device according to claim 10, wherein said charge storage section further comprises:
   a third region having a third depth formed between said second region and said second control gate section,
   wherein said charge storage gate electrode is further provided over said third region intervened by said insulating film, and
   wherein said third depth is deeper than said second depth, said third region has a third interface impurity concentration at an interface between said insulating film and said third region, and said third interface impurity concentration is lower than said second interface impurity concentration.

15. The solid-state imaging device according to claim 14, wherein said third region has a third impurity concentration distribution profile in which a maximum impurity concentration is at a third peak concentration depth which is deeper than said second peak concentration depth.

16. The solid-state imaging device according to claim 14, wherein a pinning start voltage of said first region, and a pinning start voltage of said second region and a pinning start voltage of said third region are substantially equal to each other, and
   wherein a pinning potential of said first region is lower than that of said second region, and the pinning potential of said second region is lower than that of said third region.

\* \* \* \* \*